(12) United States Patent
Ma et al.

(10) Patent No.: US 9,418,890 B2
(45) Date of Patent: Aug. 16, 2016

(54) METHOD FOR TUNING A DEPOSITION RATE DURING AN ATOMIC LAYER DEPOSITION PROCESS

(71) Applicants: Paul Ma, Santa Clara, CA (US); Joseph F. Aubuchon, San Jose, CA (US); Jiang Lu, Milpitas, CA (US); Mei Chang, Saratoga, CA (US)

(72) Inventors: Paul Ma, Santa Clara, CA (US); Joseph F. Aubuchon, San Jose, CA (US); Jiang Lu, Milpitas, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/279,260

(22) Filed: May 15, 2014

(65) Prior Publication Data
US 2014/0248772 A1    Sep. 4, 2014

Related U.S. Application Data

(63) Continuation of application No. 12/465,471, filed on May 13, 2009, now abandoned, which is a continuation of application No. 12/206,705, filed on Sep. 8, 2008, now Pat. No. 8,491,967.

(51) Int. Cl.
*H01L 21/768* (2006.01)
*C23C 16/455* (2006.01)
*C23C 16/52* (2006.01)

(52) U.S. Cl.
CPC .... *H01L 21/76841* (2013.01); *C23C 16/45534* (2013.01); *C23C 16/52* (2013.01)

(58) Field of Classification Search
None
See application file for complete search history.

(56) References Cited

U.S. PATENT DOCUMENTS

| 4,389,973 A | 6/1983 | Suntola et al. |
| 4,413,022 A | 11/1983 | Suntola et al. |
| 4,486,487 A | 12/1984 | Skarp et al. |
| 4,693,208 A | 9/1987 | Sakai et al. |

(Continued)

FOREIGN PATENT DOCUMENTS

| EP | 0 973 189 | 1/2000 |
| EP | 0 973 191 | 1/2000 |

(Continued)

OTHER PUBLICATIONS

Suzuki JP2007281518 Oct. 2007—full English machine translation.*

(Continued)

*Primary Examiner* — Joseph Miller, Jr.
(74) *Attorney, Agent, or Firm* — Patterson & Sheridan, LLP

(57) ABSTRACT

Embodiments of the invention provide methods for depositing a material on a substrate within a processing chamber during a vapor deposition process, such as an atomic layer deposition (ALD) process. In one embodiment, a method is provided which includes sequentially exposing the substrate to a first precursor gas and at least a second precursor gas while depositing a material on the substrate during the ALD process, and continuously or periodically exposing the substrate to a treatment gas prior to and/or during the ALD process. The deposition rate of the material being deposited may be controlled by varying the amount of treatment gas exposed to the substrate. In one example, tantalum nitride is deposited on the substrate and the alkylamino metal precursor gas contains a tantalum precursor, such as pentakis(dimethylamino) tantalum (PDMAT), the second precursor gas contains a nitrogen precursor, such as ammonia, and the treatment gas contains dimethylamine (DMA).

25 Claims, 1 Drawing Sheet

(56) References Cited

U.S. PATENT DOCUMENTS

| | | | |
|---|---|---|---|
| 5,290,609 | A | 3/1994 | Horiike et al. |
| 5,306,666 | A | 4/1994 | Izumi et al. |
| 5,374,570 | A | 12/1994 | Nasu et al. |
| 5,526,244 | A | 6/1996 | Bishop |
| 5,711,811 | A | 1/1998 | Suntola et al. |
| 5,834,372 | A | 11/1998 | Lee et al. |
| 5,916,365 | A | 6/1999 | Sherman |
| 5,923,056 | A | 7/1999 | Lee et al. |
| 5,989,345 | A | 11/1999 | Hatano et al. |
| 6,001,420 | A | 12/1999 | Mosely et al. |
| 6,013,553 | A | 1/2000 | Wallace et al. |
| 6,015,590 | A | 1/2000 | Suntola et al. |
| 6,015,917 | A | 1/2000 | Bhandari et al. |
| 6,020,243 | A | 2/2000 | Wallace et al. |
| 6,060,755 | A | 5/2000 | Ma et al. |
| 6,084,302 | A | 7/2000 | Sandhu |
| 6,124,158 | A | 9/2000 | Dautartas et al. |
| 6,139,700 | A | 10/2000 | Kang et al. |
| 6,144,060 | A | 11/2000 | Park et al. |
| 6,174,809 | B1 | 1/2001 | Kang et al. |
| 6,197,683 | B1 | 3/2001 | Kang et al. |
| 6,200,893 | B1 | 3/2001 | Sneh |
| 6,203,613 | B1 | 3/2001 | Gates et al. |
| 6,207,302 | B1 | 3/2001 | Sugiura et al. |
| 6,207,487 | B1 | 3/2001 | Kim et al. |
| 6,238,734 | B1 | 5/2001 | Senzaki et al. |
| 6,270,572 | B1 | 8/2001 | Kim et al. |
| 6,284,646 | B1 | 9/2001 | Leem |
| 6,287,965 | B1 | 9/2001 | Kang et al. |
| 6,291,283 | B1 | 9/2001 | Wilk |
| 6,291,867 | B1 | 9/2001 | Wallace et al. |
| 6,294,836 | B1 | 9/2001 | Paranjpe et al. |
| 6,297,172 | B1 | 10/2001 | Kashiwagi et al. |
| 6,297,539 | B1 | 10/2001 | Ma et al. |
| 6,299,294 | B1 | 10/2001 | Regan |
| 6,305,314 | B1 | 10/2001 | Sneh et al. |
| 6,342,277 | B1 | 1/2002 | Sherman |
| 6,348,376 | B2 | 2/2002 | Lim et al. |
| 6,348,386 | B1 | 2/2002 | Gilmer |
| 6,358,829 | B2 | 3/2002 | Yoon et al. |
| 6,365,502 | B1 | 4/2002 | Paranjpe et al. |
| 6,372,598 | B2 | 4/2002 | Kang et al. |
| 6,379,748 | B1 | 4/2002 | Bhandari et al. |
| 6,391,785 | B1 | 5/2002 | Satta et al. |
| 6,391,803 | B1 | 5/2002 | Kim et al. |
| 6,395,650 | B1 | 5/2002 | Callegari et al. |
| 6,399,208 | B1 | 6/2002 | Baum et al. |
| 6,399,491 | B2 | 6/2002 | Jeon et al. |
| 6,416,577 | B1 | 7/2002 | Suntoloa et al. |
| 6,416,822 | B1 | 7/2002 | Chiang et al. |
| 6,420,279 | B1 | 7/2002 | Ono et al. |
| 6,428,859 | B1 | 8/2002 | Chiang et al. |
| 6,444,263 | B1 | 9/2002 | Paranjpe et al. |
| 6,451,119 | B2 | 9/2002 | Sneh et al. |
| 6,451,695 | B2 | 9/2002 | Sneh |
| 6,452,229 | B1 | 9/2002 | Krivokapic |
| 6,458,701 | B1 | 10/2002 | Chae et al. |
| 6,468,924 | B2 | 10/2002 | Lee et al. |
| 6,475,276 | B1 | 11/2002 | Elers et al. |
| 6,475,910 | B1 | 11/2002 | Sneh |
| 6,478,872 | B1 | 11/2002 | Chae et al. |
| 6,482,262 | B1 | 11/2002 | Elers et al. |
| 6,482,733 | B2 | 11/2002 | Raaijmakers et al. |
| 6,498,091 | B1 | 12/2002 | Chen et al. |
| 6,511,539 | B1 | 1/2003 | Raaijmakers |
| 6,524,952 | B1 | 2/2003 | Srinivas et al. |
| 6,534,395 | B2 | 3/2003 | Werkhoven et al. |
| 6,548,424 | B2 | 4/2003 | Putkonen |
| 6,551,929 | B1 | 4/2003 | Kori et al. |
| 6,569,501 | B2 | 5/2003 | Chiang et al. |
| 6,585,823 | B1 | 7/2003 | Van Wijck |
| 6,593,484 | B2 | 7/2003 | Yasuhara et al. |
| 6,596,602 | B2 | 7/2003 | Iizuka et al. |
| 6,596,643 | B2 | 7/2003 | Chen et al. |
| 6,599,572 | B2 | 7/2003 | Saanila et al. |
| 6,607,973 | B1 | 8/2003 | Jeon |
| 6,607,976 | B2 | 8/2003 | Chen et al. |
| 6,620,723 | B1 | 9/2003 | Byun et al. |
| 6,627,995 | B2 | 9/2003 | Paranjpe et al. |
| 6,630,201 | B2 | 10/2003 | Chiang et al. |
| 6,632,279 | B1 | 10/2003 | Ritala et al. |
| 6,645,847 | B2 | 11/2003 | Paranjpe et al. |
| 6,660,622 | B2 | 12/2003 | Chen et al. |
| 6,660,659 | B1 | 12/2003 | Kraus et al. |
| 6,674,138 | B1 | 1/2004 | Halliyal et al. |
| 6,686,271 | B2 | 2/2004 | Raaijmakers et al. |
| 6,713,846 | B1 | 3/2004 | Senzaki |
| 6,718,126 | B2 | 4/2004 | Lei |
| 6,720,027 | B2 | 4/2004 | Yang et al. |
| 6,740,585 | B2 | 5/2004 | Yoon et al. |
| 6,772,072 | B2 | 8/2004 | Ganguli et al. |
| 6,773,507 | B2 | 8/2004 | Jallepally et al. |
| 6,777,352 | B2 | 8/2004 | Tepman et al. |
| 6,784,096 | B2 | 8/2004 | Chen et al. |
| 6,790,773 | B1 | 9/2004 | Drewery et al. |
| 6,800,173 | B2 | 10/2004 | Chiang et al. |
| 6,803,272 | B1 | 10/2004 | Halliyal et al. |
| 6,812,126 | B1 | 11/2004 | Paranjpe et al. |
| 6,815,285 | B2 | 11/2004 | Choi et al. |
| 6,821,563 | B2 | 11/2004 | Yudovsky |
| 6,831,004 | B2 | 12/2004 | Byun et al. |
| 6,831,021 | B2 | 12/2004 | Chua et al. |
| 6,838,125 | B2 | 1/2005 | Chung et al. |
| 6,846,516 | B2 | 1/2005 | Yang et al. |
| 6,849,545 | B2 | 2/2005 | Mak et al. |
| 6,858,547 | B2 | 2/2005 | Metzner et al. |
| 6,861,356 | B2 | 3/2005 | Matsuse et al. |
| 6,875,271 | B2 | 4/2005 | Glenn et al. |
| 6,893,915 | B2 | 5/2005 | Park et al. |
| 6,897,106 | B2 | 5/2005 | Park et al. |
| 6,905,541 | B2 | 6/2005 | Chen et al. |
| 6,905,737 | B2 | 6/2005 | Verplancken et al. |
| 6,911,391 | B2 | 6/2005 | Yang et al. |
| 6,915,592 | B2 | 7/2005 | Guenther |
| 6,916,398 | B2 | 7/2005 | Chen et al. |
| 6,924,191 | B2 | 8/2005 | Liu et al. |
| 6,930,060 | B2 | 8/2005 | Chou et al. |
| 6,936,906 | B2 | 8/2005 | Chung et al. |
| 6,939,801 | B2 | 9/2005 | Chung et al. |
| 6,951,804 | B2 | 10/2005 | Seutter et al. |
| 6,953,742 | B2 | 10/2005 | Chen et al. |
| 6,955,211 | B2 | 10/2005 | Ku et al. |
| 6,958,296 | B2 | 10/2005 | Chen et al. |
| 6,969,539 | B2 | 11/2005 | Gordon et al. |
| 6,972,267 | B2 | 12/2005 | Cao et al. |
| 6,974,771 | B2 | 12/2005 | Chen et al. |
| 6,998,014 | B2 | 2/2006 | Chen et al. |
| 7,005,697 | B2 | 2/2006 | Batra et al. |
| 7,026,238 | B2 | 4/2006 | Xi et al. |
| 7,041,335 | B2 | 5/2006 | Chung |
| 7,049,226 | B2 | 5/2006 | Chung et al. |
| 7,067,422 | B2 | 6/2006 | Nakamura et al. |
| 7,067,439 | B2 | 6/2006 | Metzner et al. |
| 7,081,271 | B2 | 7/2006 | Chung et al. |
| 7,081,409 | B2 | 7/2006 | Kang et al. |
| 7,094,680 | B2 | 8/2006 | Seutter et al. |
| 7,094,685 | B2 | 8/2006 | Yang et al. |
| 7,098,131 | B2 | 8/2006 | Kang et al. |
| 7,118,779 | B2 | 10/2006 | Verghese et al. |
| 7,186,385 | B2 | 3/2007 | Ganguli et al. |
| 7,204,886 | B2 | 4/2007 | Chen et al. |
| 7,208,413 | B2 | 4/2007 | Byun et al. |
| 7,211,508 | B2 | 5/2007 | Chung et al. |
| 7,408,225 | B2 | 8/2008 | Shinriki et al. |
| 8,491,967 | B2 | 7/2013 | Ma et al. |
| 2001/0000866 | A1 | 5/2001 | Sneh et al. |
| 2001/0002280 | A1 | 5/2001 | Sneh |
| 2001/0009140 | A1 | 7/2001 | Bondestam et al. |
| 2001/0009695 | A1 | 7/2001 | Saanila et al. |
| 2001/0021589 | A1 | 9/2001 | Wilk |
| 2001/0024387 | A1 | 9/2001 | Raaijmakers et al. |
| 2001/0025979 | A1 | 10/2001 | Kim et al. |
| 2001/0028924 | A1 | 10/2001 | Sherman |
| 2001/0029092 | A1 | 10/2001 | Park et al. |

(56) References Cited

U.S. PATENT DOCUMENTS

| | | |
|---|---|---|
| 2001/0029891 A1 | 10/2001 | Oh et al. |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |
| 2001/0054769 A1 | 12/2001 | Raaijmakers et al. |
| 2002/0000598 A1 | 1/2002 | Kang et al. |
| 2002/0005556 A1 | 1/2002 | Cartier et al. |
| 2002/0007790 A1 | 1/2002 | Park |
| 2002/0008297 A1 | 1/2002 | Park et al. |
| 2002/0009544 A1 | 1/2002 | McFeely et al. |
| 2002/0014647 A1 | 2/2002 | Seidl et al. |
| 2002/0015790 A1 | 2/2002 | Baum et al. |
| 2002/0020869 A1 | 2/2002 | Park et al. |
| 2002/0021544 A1 | 2/2002 | Cho et al. |
| 2002/0029092 A1 | 3/2002 | Gass |
| 2002/0031618 A1 | 3/2002 | Sherman |
| 2002/0041931 A1 | 4/2002 | Suntola et al. |
| 2002/0043666 A1 | 4/2002 | Parsons et al. |
| 2002/0048635 A1 | 4/2002 | Kim et al. |
| 2002/0052097 A1 | 5/2002 | Park |
| 2002/0060363 A1 | 5/2002 | Xi et al. |
| 2002/0064970 A1 | 5/2002 | Chooi et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081826 A1 | 6/2002 | Rotondaro et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0093046 A1 | 7/2002 | Moriya et al. |
| 2002/0093781 A1 | 7/2002 | Bachhofer et al. |
| 2002/0094689 A1 | 7/2002 | Park |
| 2002/0098627 A1 | 7/2002 | Pomarede et al. |
| 2002/0102818 A1 | 8/2002 | Sandhu et al. |
| 2002/0104481 A1 | 8/2002 | Chiang et al. |
| 2002/0106536 A1 | 8/2002 | Lee et al. |
| 2002/0106846 A1 | 8/2002 | Seutter et al. |
| 2002/0115886 A1 | 8/2002 | Yasuhara et al. |
| 2002/0117399 A1 | 8/2002 | Chen et al. |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0146895 A1 | 10/2002 | Ramdani et al. |
| 2002/0151152 A1 | 10/2002 | Shimamoto et al. |
| 2002/0153579 A1 | 10/2002 | Yamamoto |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0172768 A1 | 11/2002 | Endo et al. |
| 2002/0175393 A1 | 11/2002 | Baum et al. |
| 2002/0177282 A1 | 11/2002 | Song |
| 2002/0180028 A1 | 12/2002 | Borovik et al. |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0192396 A1 | 12/2002 | Wang et al. |
| 2002/0195643 A1 | 12/2002 | Harada |
| 2002/0197402 A1 | 12/2002 | Chiang et al. |
| 2002/0197856 A1 | 12/2002 | Matsuse et al. |
| 2002/0197863 A1 | 12/2002 | Mak et al. |
| 2002/0197881 A1 | 12/2002 | Ramdani et al. |
| 2003/0013300 A1 | 1/2003 | Byun |
| 2003/0013320 A1 | 1/2003 | Kim et al. |
| 2003/0017697 A1 | 1/2003 | Choi et al. |
| 2003/0022487 A1 | 1/2003 | Yoon et al. |
| 2003/0022507 A1 | 1/2003 | Chen et al. |
| 2003/0029715 A1 | 2/2003 | Yu et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0068437 A1 | 4/2003 | Nakamura et al. |
| 2003/0072884 A1 | 4/2003 | Zhang et al. |
| 2003/0072975 A1 | 4/2003 | Shero et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0087520 A1 | 5/2003 | Chen et al. |
| 2003/0089308 A1 | 5/2003 | Raaijmakers |
| 2003/0089942 A1 | 5/2003 | Bhattacharyya |
| 2003/0096473 A1 | 5/2003 | Shih et al. |
| 2003/0101927 A1 | 6/2003 | Raaijmakers |
| 2003/0104710 A1 | 6/2003 | Visokay et al. |
| 2003/0106490 A1 | 6/2003 | Jallepally et al. |
| 2003/0108674 A1 | 6/2003 | Chung et al. |
| 2003/0109114 A1 | 6/2003 | Niwa |
| 2003/0113187 A1 | 6/2003 | Lei et al. |
| 2003/0116087 A1 | 6/2003 | Nguyen et al. |
| 2003/0116804 A1 | 6/2003 | Visokay et al. |
| 2003/0121608 A1 | 7/2003 | Chen et al. |
| 2003/0124262 A1 | 7/2003 | Chen et al. |
| 2003/0129826 A1 | 7/2003 | Werkhoven et al. |
| 2003/0133861 A1 | 7/2003 | Bowen et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153177 A1 | 8/2003 | Tepman et al. |
| 2003/0160277 A1 | 8/2003 | Bhattacharyya |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0185980 A1 | 10/2003 | Endo |
| 2003/0186495 A1 | 10/2003 | Saanila et al. |
| 2003/0188682 A1 | 10/2003 | Tois et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194853 A1 | 10/2003 | Jeon |
| 2003/0205729 A1 | 11/2003 | Basceri et al. |
| 2003/0213987 A1 | 11/2003 | Basceri et al. |
| 2003/0219942 A1 | 11/2003 | Choi et al. |
| 2003/0224578 A1 | 12/2003 | Chung et al. |
| 2003/0224600 A1 | 12/2003 | Cao et al. |
| 2003/0227033 A1 | 12/2003 | Ahn et al. |
| 2003/0232497 A1 | 12/2003 | Xi et al. |
| 2003/0232501 A1 | 12/2003 | Kher et al. |
| 2003/0232506 A1 | 12/2003 | Metzner et al. |
| 2003/0232513 A1 | 12/2003 | Kraus et al. |
| 2003/0234417 A1 | 12/2003 | Raaijmakers et al. |
| 2003/0235961 A1 | 12/2003 | Metzner et al. |
| 2004/0005749 A1 | 1/2004 | Choi et al. |
| 2004/0007747 A1 | 1/2004 | Visokay et al. |
| 2004/0009307 A1 | 1/2004 | Koh et al. |
| 2004/0009336 A1 | 1/2004 | Marcadal et al. |
| 2004/0009675 A1 | 1/2004 | Eissa et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014320 A1 | 1/2004 | Chen et al. |
| 2004/0015300 A1 | 1/2004 | Ganguli et al. |
| 2004/0016973 A1 | 1/2004 | Rotondaro et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0023461 A1 | 2/2004 | Ahn et al. |
| 2004/0023462 A1 | 2/2004 | Rotondaro et al. |
| 2004/0025370 A1 | 2/2004 | Guenther |

(56) References Cited

U.S. PATENT DOCUMENTS

| | | |
|---|---|---|
| 2004/0028952 A1 | 2/2004 | Cartier et al. |
| 2004/0029321 A1 | 2/2004 | Ang et al. |
| 2004/0033698 A1 | 2/2004 | Lee et al. |
| 2004/0036111 A1 | 2/2004 | Nishikawa et al. |
| 2004/0038486 A1 | 2/2004 | Chua et al. |
| 2004/0038554 A1 | 2/2004 | Ahn et al. |
| 2004/0040501 A1 | 3/2004 | Vaartstra |
| 2004/0043149 A1 | 3/2004 | Gordon et al. |
| 2004/0043569 A1 | 3/2004 | Ahn et al. |
| 2004/0043623 A1 | 3/2004 | Liu et al. |
| 2004/0043630 A1 | 3/2004 | Vaartstra et al. |
| 2004/0046197 A1 | 3/2004 | Basceri et al. |
| 2004/0048461 A1 | 3/2004 | Chen et al. |
| 2004/0048491 A1 | 3/2004 | Jung et al. |
| 2004/0051152 A1 | 3/2004 | Nakajima |
| 2004/0053484 A1 | 3/2004 | Kumar et al. |
| 2004/0065255 A1 | 4/2004 | Yang et al. |
| 2004/0067641 A1 | 4/2004 | Yudovsky |
| 2004/0071897 A1 | 4/2004 | Verplancken et al. |
| 2004/0077182 A1 | 4/2004 | Lim et al. |
| 2004/0077183 A1 | 4/2004 | Chung |
| 2004/0105934 A1 | 6/2004 | Chang et al. |
| 2004/0144311 A1 | 7/2004 | Chen et al. |
| 2004/0157391 A1 | 8/2004 | Park et al. |
| 2004/0170403 A1 | 9/2004 | Lei |
| 2004/0187304 A1 | 9/2004 | Chen et al. |
| 2004/0197492 A1 | 10/2004 | Chen et al. |
| 2004/0198069 A1 | 10/2004 | Metzner et al. |
| 2004/0203254 A1 | 10/2004 | Conley et al. |
| 2004/0209460 A1 | 10/2004 | Xi et al. |
| 2004/0211665 A1 | 10/2004 | Yoon et al. |
| 2004/0214354 A1 | 10/2004 | Marsh et al. |
| 2004/0216670 A1 | 11/2004 | Gutsche et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0256351 A1 | 12/2004 | Chung et al. |
| 2004/0256664 A1 | 12/2004 | Chou et al. |
| 2004/0266175 A1 | 12/2004 | Chen et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0009371 A1 | 1/2005 | Metzner et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0074968 A1 | 4/2005 | Chen et al. |
| 2005/0104142 A1 | 5/2005 | Narayanan et al. |
| 2005/0106865 A1 | 5/2005 | Chung et al. |
| 2005/0118804 A1 | 6/2005 | Byun et al. |
| 2005/0130438 A1 | 6/2005 | Rotondaro et al. |
| 2005/0139948 A1 | 6/2005 | Chung et al. |
| 2005/0153571 A1 | 7/2005 | Senzaki |
| 2005/0164487 A1 | 7/2005 | Seutter et al. |
| 2005/0173068 A1 | 8/2005 | Chen et al. |
| 2005/0189072 A1 | 9/2005 | Chen et al. |
| 2005/0208217 A1 | 9/2005 | Shinriki et al. |
| 2005/0220998 A1 | 10/2005 | Chang et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0255690 A1 | 11/2005 | Chen et al. |
| 2005/0257735 A1 | 11/2005 | Guenther |
| 2005/0260347 A1 | 11/2005 | Narwankar et al. |
| 2005/0260357 A1 | 11/2005 | Olsen et al. |
| 2005/0266682 A1 | 12/2005 | Chen et al. |
| 2005/0271812 A1 | 12/2005 | Myo et al. |
| 2005/0271813 A1 | 12/2005 | Kher et al. |
| 2005/0277290 A1 | 12/2005 | Yang et al. |
| 2006/0019033 A1 | 1/2006 | Muthukrishnan et al. |
| 2006/0019494 A1 | 1/2006 | Cao et al. |
| 2006/0019495 A1 | 1/2006 | Marcadal et al. |
| 2006/0030148 A1 | 2/2006 | Seutter et al. |
| 2006/0035025 A1 | 2/2006 | Verplancken et al. |
| 2006/0040054 A1 | 2/2006 | Pearlstein et al. |
| 2006/0057843 A1 | 3/2006 | Chen et al. |
| 2006/0062917 A1 | 3/2006 | Muthukrishnan et al. |
| 2006/0075966 A1 | 4/2006 | Chen et al. |
| 2006/0128150 A1 | 6/2006 | Gandikota et al. |
| 2006/0148253 A1 | 7/2006 | Chung et al. |
| 2006/0153973 A1 | 7/2006 | Chang et al. |
| 2006/0153995 A1 | 7/2006 | Narwankar et al. |
| 2006/0156979 A1 | 7/2006 | Thakur et al. |
| 2006/0199372 A1 | 9/2006 | Chung et al. |
| 2006/0208215 A1 | 9/2006 | Metzner et al. |
| 2006/0216928 A1 | 9/2006 | Chung et al. |
| 2006/0223339 A1 | 10/2006 | Metzner et al. |
| 2006/0257295 A1 | 11/2006 | Chen et al. |
| 2006/0264067 A1 | 11/2006 | Kher et al. |
| 2006/0276020 A1 | 12/2006 | Yoon et al. |
| 2006/0292864 A1 | 12/2006 | Yang et al. |
| 2007/0003698 A1 | 1/2007 | Chen et al. |
| 2007/0018244 A1 | 1/2007 | Hung et al. |
| 2007/0020890 A1 | 1/2007 | Thakur et al. |
| 2007/0026147 A1 | 2/2007 | Chen et al. |
| 2007/0049043 A1 | 3/2007 | Muthukrishnan et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0067609 A1 | 3/2007 | Chen et al. |
| 2007/0099415 A1 | 5/2007 | Chen et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2008/0064210 A1 | 3/2008 | Vaartstra |
| 2009/0032952 A1 | 2/2009 | Chen et al. |
| 2010/0062614 A1 | 3/2010 | Ma et al. |

FOREIGN PATENT DOCUMENTS

| | | |
|---|---|---|
| EP | 1 146 141 | 10/2001 |
| EP | 1 170 804 | 1/2002 |
| EP | 1167569 A1 | 1/2002 |
| EP | 1 321 973 | 6/2003 |
| GB | 2 355 727 | 5/2001 |
| JP | 02-246161 A | 10/1990 |
| JP | 07-300649 | 11/1995 |
| JP | H09-500763 A | 1/1997 |
| JP | 10-308283 | 11/1998 |
| JP | 2000-031387 | 1/2000 |
| JP | 2000-058777 | 2/2000 |
| JP | 2001-108199 A | 4/2001 |
| JP | 2001-111000 | 4/2001 |
| JP | 2001-172767 | 6/2001 |
| JP | 2001-220294 | 8/2001 |
| JP | 2001-254181 | 9/2001 |
| JP | 2002-060944 A | 2/2002 |
| JP | 2002-069641 | 3/2002 |
| JP | 2002-093804 | 3/2002 |
| JP | 2002-167672 | 6/2002 |
| JP | 2002-172767 | 6/2002 |
| JP | 2004-214622 A | 7/2004 |
| JP | 2006-522225 A | 9/2006 |
| JP | 2007-281518 A | 10/2007 |
| JP | 2007-537605 A | 12/2007 |
| TW | 200403354 A | 3/2004 |
| TW | 200419642 A | 10/2004 |
| TW | 200801228 A | 1/2008 |
| TW | 200912030 A | 3/2009 |
| TW | 201016880 A | 5/2010 |
| WO | WO-9617107 A1 | 6/1996 |
| WO | WO-9901595 A1 | 1/1999 |
| WO | WO-9929924 A1 | 6/1999 |
| WO | WO-9965064 A1 | 12/1999 |
| WO | WO-00-13235 | 3/2000 |
| WO | WO-0015865 | 3/2000 |
| WO | WO-0016377 | 3/2000 |
| WO | WO-0054320 | 9/2000 |
| WO | WO-0063957 | 10/2000 |
| WO | WO-0070674 | 11/2000 |
| WO | WO-0079576 A1 | 12/2000 |

(56) References Cited

FOREIGN PATENT DOCUMENTS

| | | |
|---|---|---|
| WO | WO-0115220 A1 | 3/2001 |
| WO | WO-0117692 A1 | 3/2001 |
| WO | WO-01/29891 A1 | 4/2001 |
| WO | WO-0125502 | 4/2001 |
| WO | WO-0127346 A1 | 4/2001 |
| WO | WO-0127347 A1 | 4/2001 |
| WO | WO-0129280 A1 | 4/2001 |
| WO | WO-0129893 A1 | 4/2001 |
| WO | WO-0136702 A1 | 5/2001 |
| WO | WO-0140541 A1 | 6/2001 |
| WO | WO-0166832 A2 | 9/2001 |
| WO | WO-0182390 | 11/2001 |
| WO | WO-0199166 | 12/2001 |
| WO | WO-0201628 | 1/2002 |
| WO | WO 0208485 | 1/2002 |
| WO | WO-0209167 | 1/2002 |
| WO | WO-0227063 | 4/2002 |
| WO | WO-0243115 | 5/2002 |
| WO | WO-0245167 | 6/2002 |
| WO | WO-0245871 A1 | 6/2002 |
| WO | WO-0246489 | 6/2002 |
| WO | WO-02067319 | 8/2002 |
| WO | WO-2004010471 | 1/2004 |
| WO | WO-2004106584 | 12/2004 |
| WO | 2007038050 A2 | 4/2007 |

OTHER PUBLICATIONS

Argarwal, et al. "Challenges in Integrating the High-K Gate Dielectric Film to the Conventional CMOS Process Flow" Mat. Sec. Soc. Sump. Proc. vol. 670 (2001).

Balog, et al. "Chemical Vapor Deposition and Characterization of HfO2 Films from Organo-Hafnium Compounds," Thin Solid Films, 41 (1977) 247-259.

Cameron, et al. "Atomic Layer Deposition of SiO2 and TiO2 in Alumina Tubular Membranes," Langmuir, vol. 16, No. 19, American Chemical Society, 2000, pp. 7435-7444.

Chatham, Hood; et al. "Nitridation of Hafnium Silicate Thin Films", Mat. Res. Soc. Symp. Proc. vol. 811, Apr. 12-16, 2004, D7.5.1.

Cheon, et al. "Gas Phase Photoproduction of Diatomic Metal Nitrides During Metal Nitride Laser Chemical Vapor Deposition," Inorg. Chem. 1999, 38, 2238-2239.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Conley, J.F.; et al. "Interval Annealing During Alternating Pulse Deposition", Mat. Res. Soc. Symp. Proc. vol. 811, Apr. 12-16, 2004, D1.3.1.

Dey, et al. "Ruthenium films by digital chemical vapor deposition: Selectivity, nanostructure, and work function," Applied Physics Letter, vol. 84, No. 9, Mar. 1, 2004, American Institute of Physics, pp. 1606.

Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

George, et al. "Surface Chemistry for Atomic Layer Growth," J. Phys. Chem. (1996), 100, 13121-13131.

Goswami, et al. Transition Metals Show Promise as Copper Barriers, Semiconductor International, ATMI, San Jose—May 1, 2004.

Goto, et al. "Atomic layer controlled deposition of silicon nitride with self-limiting mechanism," Applied Physics Letters, American Institute of Physics. New York, US, vol. 68, No. 23, Jun. 3, 1996, pp. 3257-3259.

He, et al. "Pulsed Deposition of Silicate Films," Journal of Applied Physics, vol. 94, No. 5, Sep. 1, 2003, pp. 3657-3659.

Hendrix, et al. "Composition control of Hf1-xSixO2 films deposited on Si by chemical-vapor deposition using amide precursors," Applied Physics Letters, American Institute of Physics. New York, US, vol. 80, No. 13, Apr. 1, 2002, pp. 2362-2364.

Ho, et al. "Suppressed crystallization of Hf-based gate dielectrics by controlled addition of Al2O3 using atomic layer deposition", Applied Physics Letters, American Institute of Physics, New York, US, vol. 81, No. 22, Nov. 25, 2002, pp. 4218-4220.

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hwang, et al. "Nanometer-Size ?-PbO2-type TiO2 in Garnet: A Thermobarometer for Ultrahigh-Pressure Metamorphism," Science Vo. 288 (Apr. 14, 2000).

Kang, et al. "Infrared Spectroscopic Study of Atomic Layer Deposition Mechanism for Hafnium Silicate Thin Films Using HfCl2 [N(SiMe3) 2}2 and H2O," J. Vac. Sci. Technol. A 22(6), Nov./Dec. 2004, American Vacuum Society, pp. 2393-2397.

Kamiyama, et al. "Improvement in the uniformity and the thermal stability of Hf-silicate gate dielectric by plasma-nitridation," Gate Insulator, 2003. IWGI 2003. Extended Abstracts of International Workshop on Nov. 6-7, 2003, Piscataway, NJ, USA, IEEE, Nov. 6, 2002, pp. 42-46.

Kattelus, et al. "Electrical Properties of Tantalum Based Composite Oxide Films," Mat. Res. Soc. Symp. Proc., 284 (1993) 511-516.

Kawahara, et al. "Effects of Hf sources, oxidizing agents, and NH3 radicals on properties of HfAlOx films prepared by atomic layer deposition", IWGI 2003, Tokyo, Nov. 6, 2003, pp. 32-37.

Klaus, et al. "Atomic Layer Deposition of SiO2 Using Catalyzed and Uncatalyzed Self-Limiting Surface Reactions," Surface Review and Letters, vol. 6, Nos. 3 & 4 (1999), pp. 435-448.

Kukli, et al. "Atomic Layer Deposition of Hafnium Dioxide Films from Hafnium Tetrakis(ethylmethylamide) and Water", Chemical Vapor Deposition, VCH Publishers, Weinheim, DE, vol. 8, No. 5, Sep. 2002, pp. 199-204.

Kukli, et al. "Atomic Layer Epitaxy Growth of Tantalum Oxide Thin Films from Ta(OC2H5)5 and H2O," Journal of the Electrochemical Society, vol. 142, No. 5, May 1995; p. 1670-5.

Kukli, et al. "In situ Study of Atomic Layer Epitaxy Growth of Tantalum Oxide Thin Films From Ta(OC2H5)5 and H2O," Applied Surface Science, vol. 112, Mar. 1997, p. 236-42.

Kukli, et al. "Properties of {Nb1-xTax}2O5 Solid Solutions and {Nb1-xTax}2O5—ZrO2 Nanolaminates Grown by Atomic Layer Epitaxy," 1997; p. 785-93.

Kukli, et al. "Properties of Ta2O5-Based Dielectric Nanolaminates Deposited by Atomic Layer Epitaxy," Journal of the Electrochemical Society, vol. 144, No. 1, Jan. 1997; p. 300-6.

Kukli, et al. "Tailoring the Dielectric Properties of HfO2-Ta2O5 Nanolaminates," Applied Physics Letters, vol. 68, No. 26 (Jun. 24, 1996), pp. 3737-3739.

Martensson, et al. "Use of Atomic Layer Epitaxy for Fabrication of Si/TiN/Cu Structures," J. Vac. Sci. & Tech. B, vol. 17, No. 5, (Sep. 1999), pp. 2122-2128.

Min, et al. "Atomic Layer Deposition of TiN Thin Films by Sequential Introduction of Ti Precursor and NH3," Mat. Res. Soc. Symp. Proc., vol. 514 (1998).

Min, et al. "Chemical Vapor Deposition of Ti—Si—N Films With Alternating Source Supply," Mat. Rec. Soc. Symp. Proc. (1999).

Min, et al. "Metal-organic Atomic-layer Deposition of Titanium—silicon—nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23-29.

Niinisto, et al. "Synthesis of Oxide Thin Films and Overlayers by Atomic Layer Epitaxy for Advanced Applications," Materials Science and Engineering B41 (1996), pp. 23-29.

Ohshita, et al. "Hf1-xSixO2 deposition by metal organic chemical vapor deposition using the Hf(NEt2)4/SiH(NEt2)3/O2 gas system", Preparation and Characterization, Elsevier Sequioa, NL, vol. 416, No. 1-2, Sep. 2, 2002, pp. 208-211.

Ohshita, et al. "HfO2 Growth by Low-pressure Chemical Vapor Deposition Using the Hf(N(C2H5)2)4/O2 Gas System," Journal of Crystal Growth 233 (2001) 292-297.

(56) References Cited

OTHER PUBLICATIONS

Park, et al. "Performance improvement of MOSFET with HfO2—Al2O3 laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From TiI4 and NH3," J. Electrochem. Soc., vol. 145, No. 8 (Aug. 1998), pp. 2914-2920.

Ritala, et al. "Atomic Layer Epitaxy Growth of TiN Thin Films," J. Electrochem. Soc., vol. 142, No. 8, Aug. 1995.

Ritala, et al. "Development of Crystallinity and Morphology in Hafnium Dioxide Thin Films Grown by Atomic Layer Epitaxy," Thin Solid Films, vol. 250, No. 1-2, (Oct. 1, 1994), p. 72-80.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al2O3 Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Ritala, et al. Ann. Acad. Sci. Fenn. Ser. A II. Chemica 257 (1994) 1-48.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Sekine, et al. "Nitrogen profile control by plasma nitridation technique for poly-Si gate HfSiON CMOSFET with excellent interface property and ultra-low leakage current," International Electron Devices Meeting 2003. IEDM. Technical Digest. Washington, DC, Dec. 8-10, 2003, New York, NY, IEEE, US, Dec. 8, 2003, pp. 103-106.

Senzaki, et al. "A Novel Atomic Layer Deposition Process to Deposit Hafnium Silicate Thin Films", Electrochemical Society Proceedings vol. 2004-01, pp. 264-270.

Shenai, et al. "Correlation of vapor pressure equation and film properties with trimethylindium purity for the MOVPE grown III-V compounds," Journal of Crystal Growth 248 (2003) pp. 91-98.

"Ta(NtC5H11)[N(CH3)2] Taimata®," http://c1005059.securesites.net/topic/Taimata/Taimata-E.htm, Jun. 13, 2007, pp. 1-3.

Visokay, et al. "Application of HfSiON as a gate dielectric material", Applied Physics Letter, American Institute of Physics, New York, US, vol. 80, No. 17, Apr. 29, 2002, pp. 3183-3185.

International Search Report and Written Opinion of the International Searching Authority mailed Mar. 25, 2010 in PCT/US2009/054321.

International Search Report and Written Opinion dated Nov. 30, 2010 for International Application No. PCT/US2010/031491.

Official Letter and Search Report for Taiwan Application No. 99112955 dated Jan. 9, 2014.

Official Letter and Search Report for Taiwan Application No. 98128270 dated Dec. 23, 2013.

Korean Office Action for related application 10-2011-7008212 dated Aug. 1, 2015.

Japanese Office Action dated Mar. 8, 2016, for Japanese Patent Application No. 2015-026462.

\* cited by examiner

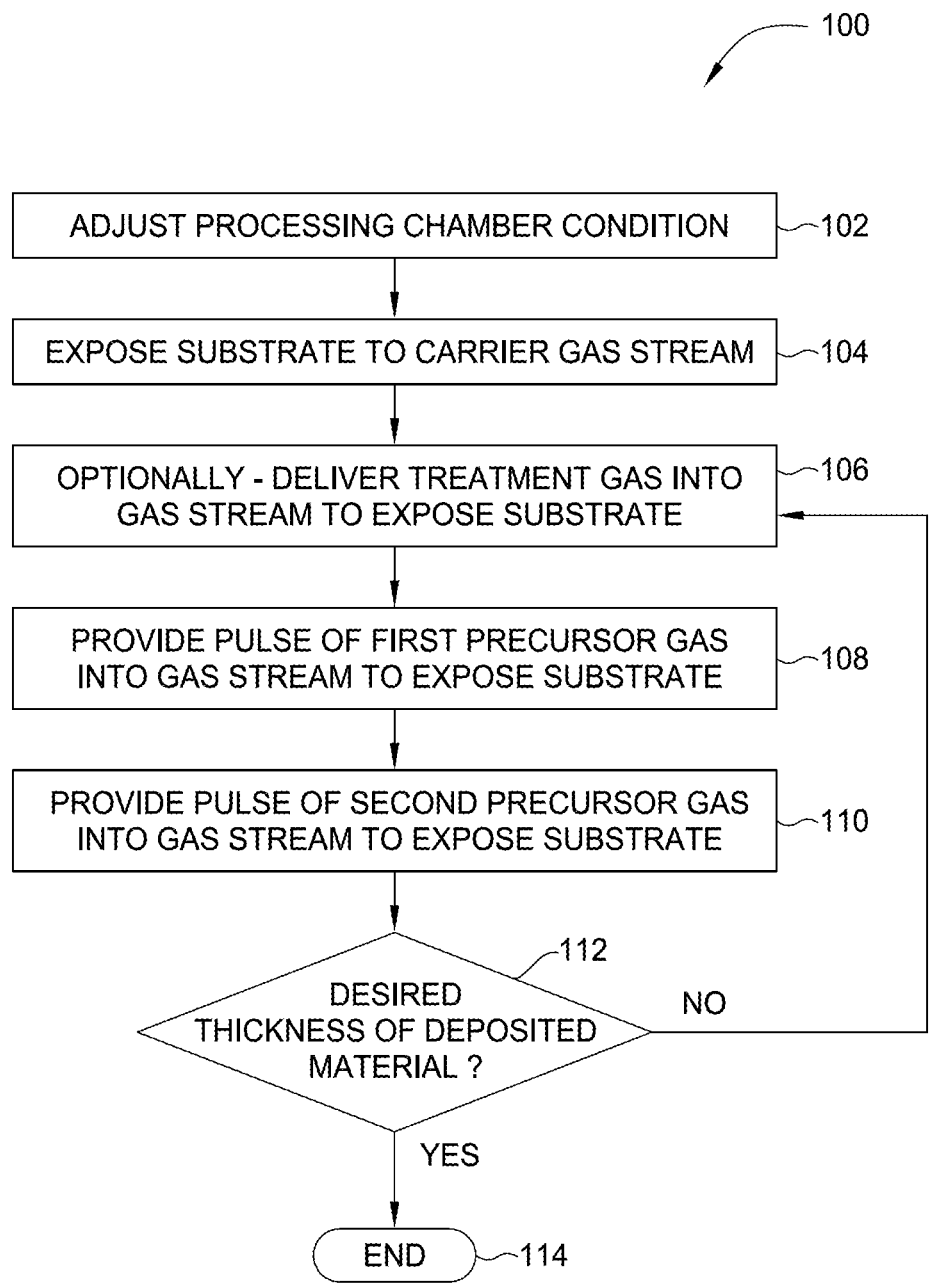

METHOD FOR TUNING A DEPOSITION RATE DURING AN ATOMIC LAYER DEPOSITION PROCESS

CROSS-REFERENCE TO RELATED APPLICATIONS

This application is a continuation of U.S. Non-provisional application Ser. No. 12/465,471, filed May 13, 2009, which is a continuation-in-part of U.S. Non-provisional application Ser. No. 12/206,705, filed Sep. 8, 2008, granted as U.S. Pat. No. 8,491,967. Both are herein incorporated by reference.

BACKGROUND

1. Field

Embodiments of the invention generally relate to semiconductor and other electronic device processing, and more particularly, to an improved method for depositing a material on a substrate during a vapor deposition process.

2. Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. The need for greater deposition rate and process control regarding layer characteristics rises as the desire for an increased circuit integration.

Tantalum-containing layers, such as tantalum, tantalum nitride, and tantalum silicon nitride, are often used in multi-level integrated circuits and pose many challenges to process control, particularly with respect to contact formation. Barrier layers formed from sputtered tantalum or reactive sputtered tantalum nitride have demonstrated properties suitable for use to control copper diffusion. Exemplary properties include high conductivity, high thermal stability, and resistance to diffusion of foreign atoms.

Both physical vapor deposition (PVD) and atomic layer deposition (ALD) processes are used to deposit tantalum-containing layers in features of small size (e.g., about 90 nm wide) and high aspect ratios of about 5:1. However, it is believed that PVD processes may have reached a limit at this size and aspect ratio, while ALD processes suffer other problems. Common problems encountered during ALD processes include the lack of stability for the deposition rate and minimum control for the thickness of each deposited layer.

An ALD process generally contains a multiplicity of cycles, such that a substrate surface is sequentially exposed to two or more reagents or precursors during each ALD cycle while forming the deposited layer. The thickness of a deposited material is the product of the number of conducted ALD cycles by the thickness of each deposited layer. The deposition rate may be used to adjust the thickness of the deposited material. The deposition rate of each ALD cycle is usually controlled by the chemical nature of the particular process. Therefore, the deposition rate may be adjusted by controlling certain process conditions, such as the delivery rate of the gaseous reagent or precursor, modifying the exposure time during the ALD cycle, or adjusting the temperature of the process or precursor. However, the deposited material is usually non-uniformly formed on the substrate surface while adjusting the deposition rate by varying these process conditions.

Therefore, there is a need for increasing the stability of the deposition rate of a deposited layer while controlling the layer thickness during a vapor deposition process.

SUMMARY

Embodiments described herein provide methods for depositing a material on a substrate within a processing chamber during a vapor deposition process, such as an atomic layer deposition (ALD) process. Generally, the substrate may be continuously or periodically exposed to a treatment gas containing a reagent prior to and/or during the vapor deposition process. The deposition rate of the material being deposited may be controlled by varying the amount of treatment gas exposed to the substrate. Therefore, the deposition rate may be adjusted, such as within a range from about 0.05 Å/cycle (Å per ALD cycle) to about 1.0 Å/cycle, for example, about 0.5 Å/cycle. In one example, the substrate may be exposed to the treatment gas to reduce the deposition rate of the material during the ALD process by about 95% or less.

In one embodiment, a method for depositing a material on a substrate surface is provided which includes exposing a substrate sequentially to an alkylamino metal precursor gas and a second precursor gas while depositing a material on the substrate during an ALD process, and exposing the substrate to a treatment gas containing an alkylamine compound prior to or during the ALD process. In one example, the deposited material contains tantalum nitride, the alkylamino metal precursor gas contains a tantalum precursor, such as pentakis (dimethylamino) tantalum (PDMAT), the second precursor gas contains a nitrogen precursor, such as ammonia, and the treatment gas contains methylamine or dimethylamine (DMA).

In another embodiment, a method for depositing a material on a substrate surface is provided which includes exposing a substrate sequentially to an alkylamino metal precursor gas and a second precursor gas while depositing a material on the substrate at a first deposition rate during an ALD process within a processing chamber, exposing the substrate to a treatment gas containing an alkylamine compound, and depositing the material on the substrate at a second deposition rate during the ALD process, wherein the second deposition rate is less than the first deposition rate.

The material may be deposited on the substrate in the absence of the treatment gas at a first deposition rate during the ALD process and in the presence of the treatment gas at a second deposition rate during the ALD process. The second deposition rate may be about 95% or less of the first deposition rate. In other examples, the second deposition rate may be about 90% or less, about 80% or less, about 70% or less, or about 50% or less of the first deposition rate. In another example, the second deposition rate may be within a range from about 0.05 Å/cycle to about 1.0 Å/cycle, such as about 0.5 Å/cycle.

In another embodiment, a method for depositing a material on a substrate surface is provided which includes exposing a substrate disposed within the processing chamber to a carrier gas having a continuous flow, and exposing the substrate sequentially to a tantalum precursor gas and a nitrogen precursor gas while depositing a tantalum nitride material on the substrate during an ALD process, wherein the tantalum precursor gas contains PDMAT. The ALD process further provides sequentially pulsing the tantalum precursor gas and the nitrogen precursor gas into the carrier gas with the continuous flow to deposit the tantalum nitride material, and introducing a treatment gas containing dimethylamine to the carrier gas to expose the substrate to the treatment gas prior to and/or during the ALD process.

In some embodiments, the method for depositing a material on a substrate surface is provided which includes sequentially or simultaneously exposing the substrate to a first precursor gas and at least a second precursor gas while depositing a material on the substrate during a vapor deposition process, and continuously or periodically exposing the substrate to a treatment gas containing a reagent prior to and/or during the vapor deposition process.

Embodiments provide that the substrate may be sequentially or simultaneously exposed to the first precursor and at least a second precursor gas during the vapor deposition process, such as an ALD process or a CVD process. Embodiments also provide that the substrate may be continuously or periodically exposed to the treatment gas prior to and/or during the vapor deposition process. In one embodiment, the vapor deposition process further includes sequentially exposing the substrate to the first precursor gas and a second precursor gas during an ALD process. In one example, the substrate may be continuously exposed to the treatment gas during the ALD process. In another example, the substrate may be periodically exposed to the treatment gas during the ALD process. In another example, the substrate may be exposed to the treatment gas prior to the ALD process. In another embodiment, the vapor deposition process further includes simultaneously exposing the substrate to the first precursor gas and a second precursor gas during a CVD process. In one example, the substrate may be continuously exposed to the treatment gas during the CVD process. In another example, the substrate may be periodically exposed to the treatment gas during the CVD process. In another example, the substrate may be exposed to the treatment gas prior to the CVD process.

In another embodiment, a method for depositing a material on a substrate surface is provided which includes exposing the substrate to a first precursor gas to deposit a material on the substrate at a first deposition rate during a vapor deposition process, wherein the first precursor gas contains a first precursor having the chemical formula of $ML'_x$, where x is 1, 2, 3, 4, 5, 6, or greater, M is an element selected from the group consisting of Ti, Zr, Hf, Nb, Ta, Mo, W, Ru, Co, Ni, Pd, Pt, Cu, Al, Ga, In, Si, Ge, Sn, P, As, and Sb, and each L' is independently a ligand selected from the group consisting of alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof, exposing the substrate to a treatment gas containing a hydrogenated ligand compound, wherein the hydrogenated ligand compound has the chemical formula of HL, where L is a ligand selected from the group consisting of alkylamino, alkylimino, alkoxy, alkyl, alkene, alkyne, cyclopentadienyl, alkylcyclopentadienyl, pentadienyl, pyrrolyl, or derivatives thereof, and depositing the material on the substrate at a second deposition rate during the vapor deposition process, wherein the second deposition rate is less than the first deposition rate. The vapor deposition process may further include exposing the substrate sequentially to the first precursor gas and a second precursor gas during the ALD process.

In many examples, the hydrogenated ligand compound within the treatment gas has the chemical formula of HL, where L is a ligand such as alkylamino, alkylimino, alkoxy, alkyl, alkene, alkyne, cyclopentadienyl, alkylcyclopentadienyl, pentadienyl, pyrrolyl, or derivatives thereof. The first precursor gas may contain a first precursor having the chemical formula of $ML'_x$, where x is 1, 2, 3, 4, 5, 6, or greater, M is an element such as Ti, Zr, Hf, Nb, Ta, Mo, W, Ru, Co, Ni, Pd, Pt, Cu, Al, Ga, In, Si, Ge, Sn, P, As, or Sb, and each L' is independently a ligand such as alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof.

In some examples, the treatment gas contains a hydrogenated ligand compound, such as an alkylamine compound having the chemical formula of $H_2NR$ or HNR'R", where each R, R', and R" is independently methyl, ethyl, propyl, butyl, amyl, phenyl, aryl, isomers thereof, derivatives thereof, or combinations thereof. The alkylamine compound may be methylamine, dimethylamine, ethylamine, diethylamine, methylethylamine, propylamine, dipropylamine, butylamine, dibutylamine, isomers thereof, derivatives thereof, or combinations thereof. The treatment gas may further contain at least one carrier gas such as ammonia, hydrogen, nitrogen, argon, helium, or combinations thereof. In one example the treatment gas contains dimethylamine, ammonia, and another carrier gas, such as argon.

In some embodiments, the alkylamino metal precursor gas contains an alkylamino metal precursor having the chemical formula of $ML'_x$, where x is 1, 2, 3, 4, 5, 6, or greater, M may be a metal or other element such as Ti, Zr, Hf, Ta, Mo, W, or Si, and each ligand L' is independently a ligand, such as an alkylamino ligand, which include $N(CH_3)_2$, $N(C_2H_5)_2$, $N(C_3H_7)_2$, $N(C_4H_9)_2$, $N(CH_3)(C_2H_5)$, isomers thereof, derivatives thereof, or combinations thereof. In some examples, the metal or element M may be Si, Ti, Zr, or Hf while x is usually 4. In other examples, the alkylamino metal precursor is a tantalum precursor with the metal M being Ta while x is usually 4 or 5. Examples of tantalum precursors include pentakis(dimethylamino) tantalum (PDMAT), pentakis(diethylamino) tantalum, pentakis(ethylmethylamino) tantalum, tert-butylimino tris(dimethylamino) tantalum, tert-butylimino tris(diethylamino) tantalum, tert-butylimino tris(ethylmethylamino) tantalum, tert-amylimino-tris(dimethylamino) tantalum, tert-amylimino-tris(diethylamino) tantalum, tert-amylimino-tris(ethylmethylamino) tantalum, or derivatives thereof. In one example, the tantalum precursor is PDMAT and the alkylamine compound gas contains methylamine or dimethylamine.

In other examples, the hydrogenated ligand compound within the treatment gas may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In examples that the hydrogenated ligand compound is an alcohol, the first precursor may contain an alkoxy ligand such as $OCH_3$, $OC_2H_5$, $OC_3H_7$, $OC_4H_9$, isomers thereof, or derivatives thereof. In other examples, the ligand L of the hydrogenated ligand compound may be cyclopentadienyl, alkylcyclopentadienyl, pentadienyl, pyrrolyl, isomers thereof, or derivatives thereof and the ligand L' of the first precursor may be cyclopentadienyl, alkylcyclopentadienyl, pentadienyl, pyrrolyl, isomers thereof, or derivatives thereof.

In one example, a method for depositing a material on a substrate surface is provided which includes exposing a substrate disposed within the processing chamber to a carrier gas having a continuous flow, introducing a treatment gas containing methylamine or dimethylamine to the continuously flowing carrier gas to expose the substrate to the treatment gas during a treatment process. The method further provides alternately or sequentially pulsing a tantalum precursor gas and a nitrogen precursor gas into the continuously flowing carrier gas to sequentially expose the substrate to the tantalum and nitrogen precursor gases while depositing a tantalum nitride material on the substrate during an ALD process. In one example, the tantalum precursor gas contains PDMAT and the nitrogen precursor gas contains ammonia.

BRIEF DESCRIPTION OF THE DRAWINGS

So that the manner in which the above recited features can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the invention may admit to other equally effective embodiments.

FIG. 1 depicts a flow diagram of a method for depositing a tantalum nitride material in accordance with embodiments described herein.

DETAILED DESCRIPTION

Embodiments described herein provide methods for depositing a material on a substrate within a processing chamber during a vapor deposition process, such as an atomic layer deposition (ALD) process or a chemical vapor deposition (CVD) process. Generally, the substrate may be continuously or periodically exposed to a treatment gas containing a reagent prior to and/or during the vapor deposition process. The treatment gas may be administered into the processing chamber and the substrate is exposed to the treatment gas prior to and/or during the vapor deposition process. The deposition rate of the material being deposited may be controlled by varying the amount of treatment gas exposed to the substrate. Therefore, the deposition rate may be adjusted, such as within a range from about 0.05 Å/cycle (A per ALD cycle) to about 1.0 Å/cycle, for example, about 0.5 Å/cycle.

In one example, the method includes exposing the substrate to the treatment gas to reduce the deposition rate of the material by about 95% or less during the ALD process. The material may be deposited on the substrate in the absence of the treatment gas at a first deposition rate during the ALD process and in the presence of the treatment gas at a second deposition rate during the ALD process. The second deposition rate may be about 95% or less of the first deposition rate. In other examples, the second deposition rate may be about 90% or less, about 80% or less, about 70% or less, or about 50% or less of the first deposition rate. In another example, the second deposition rate may be decreased relative to the first deposition rate by an amount within a range from about 0.05 Å/cycle to about 1.0 Å/cycle, such as about 0.5 Å/cycle.

In one embodiment, the substrate may be continuously or periodically exposed to a treatment gas containing a reagent, such as a hydrogenated ligand compound, during a treatment process and/or during the vapor deposition process. The hydrogenated ligand compound may be the same ligand as a free ligand formed from the metal-organic precursor used during the subsequent vapor deposition process. The free ligand is usually formed by hydrogenation or thermolysis during the deposition process. In one example, the substrate is exposed to an alkylamine compound, such as dimethylamine (DMA) during a treatment process prior to and/or during a vapor deposition process utilizing a metal-organic chemical precursor, which may have alkylamino ligands, such as pentakis(dimethylamino) tantalum (PDMAT, ((CH$_3$)$_2$N)$_5$Ta).

In many examples, the treatment gas contains a hydrogenated ligand compound having the chemical formula of HL, where L is a ligand such as alkylamino, alkylimino, alkoxy, alkyl, alkene, alkyne, cyclopentadienyl, alkylcyclopentadienyl, pentadienyl, pyrrolyl, or derivatives thereof. The chemical precursor gas contains a chemical precursor having the chemical formula of ML'$_x$, where x is 1, 2, 3, 4, 5, 6, or greater, M is an element such as Ti, Zr, Hf, Nb, Ta, Mo, W, Ru, Co, Ni, Pd, Pt, Cu, Al, Ga, In, Si, Ge, Sn, P, As, or Sb, and each L' is independently a ligand such as alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof.

In some embodiments, the method provides that the vapor deposition process is an ALD process and the substrate is sequentially exposed to the alkylamino metal precursor gas and another chemical precursor gas during the ALD process. In other embodiments, the vapor deposition process is a CVD process and the substrate is simultaneously exposed to the alkylamino metal precursor gas and another chemical precursor gas during the CVD process. In one example, the method provides exposing the substrate within the processing chamber to a treatment gas containing an alkylamine compound prior to and/or during an ALD process, and exposing the substrate sequentially to an alkylamino metal precursor gas and at least one additional chemical precursor gas while depositing a material on the substrate during the ALD process. In another example, the method provides continuously or periodically exposing the substrate to the treatment gas containing the alkylamine compound while also exposing the substrate sequentially to an alkylamino metal precursor gas and an additional chemical precursor gas while depositing the material on the substrate during the ALD process. The additional chemical precursor gas may contain a nitrogen precursor, such as ammonia, which is used to deposit a metal nitride material, such as tantalum nitride.

In some examples, the treatment gas contains an alkylamine compound having the chemical formula of H$_2$NR or HNR'R'', where each R, R', and R'' is independently methyl, ethyl, propyl, butyl, amyl, phenyl, aryl, isomers thereof, derivatives thereof, or combinations thereof. The alkylamine compound may be methylamine, dimethylamine, ethylamine, diethylamine, methylethylamine, propylamine, dipropylamine, butylamine, dibutylamine, isomers thereof, derivatives thereof, or combinations thereof. The treatment gas may further contain at least one carrier gas such as ammonia, hydrogen, nitrogen, argon, helium, or combinations thereof. In one example the treatment gas contains dimethylamine, ammonia, and another carrier gas, such as argon.

In some embodiments, the alkylamino metal precursor gas contains an alkylamino metal precursor having the chemical formula of ML'$_x$, where x is 1, 2, 3, 4, 5, 6, or greater, M may be a metal or other element such as Ti, Zr, Hf, Ta, Mo, W, or Si, and each ligand L' is independently a ligand, such as an alkylamino ligand, which include N(CH$_3$)$_2$, N(C$_2$H$_5$)$_2$, N(C$_3$H$_7$)$_2$, N(C$_4$H$_9$)$_2$, N(CH$_3$)(C$_2$H$_5$), isomers thereof, derivatives thereof, or combinations thereof. In some examples, the metal or the element M may be Si, Ti, Zr, or Hf while x is usually 4. In other examples, the alkylamino metal precursor is a tantalum precursor with the metal M being Ta while x is usually 4 or 5. Examples of tantalum precursors include pentakis(dimethylamino) tantalum, pentakis(diethylamino) tantalum, pentakis(ethylmethylamino) tantalum, tert-butylimino tris(dimethylamino) tantalum, tert-butylimino tris(diethylamino) tantalum, tert-butylimino tris(ethylmethylamino) tantalum, tert-amylimino-tris(dimethylamino) tantalum, tert-amylimino-tris(diethylamino) tantalum, tert-amylimino-tris(ethylmethylamino) tantalum, or derivatives thereof. In one example, the tantalum precursor is PDMAT and the alkylamine compound gas contains methylamine or dimethylamine.

In other examples, the hydrogenated ligand compound within the treatment gas may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In examples that the hydrogenated ligand compound is an alcohol, the chemical precursor may contain an alkoxy ligand such as $OCH_3$, $OC_2H_5$, $OC_3H_7$, $OC_4H_9$, isomers thereof, or derivatives thereof. In other examples, the ligand L of the hydrogenated ligand compound may be cyclopentadienyl, alkylcyclopentadienyl, pentadienyl, pyrrolyl, isomers thereof, or derivatives thereof and the ligand L' of the chemical precursor may be cyclopentadienyl, alkylcyclopentadienyl, pentadienyl, pyrrolyl, isomers thereof, or derivatives thereof.

In one example, a method for depositing a material on a substrate surface is provided which includes exposing a substrate disposed within the processing chamber to a carrier gas having a continuous flow, introducing a treatment gas containing methylamine or dimethylamine to the continuously flowing carrier gas to expose the substrate to the treatment gas during a treatment process. The method further provides alternately or sequentially pulsing a tantalum precursor gas and a nitrogen precursor gas into the continuously flowing carrier gas to sequentially expose the substrate to the tantalum and nitrogen precursor gases while depositing a tantalum nitride material on the substrate during an ALD process. In one example, the tantalum precursor gas contains PDMAT and the nitrogen precursor gas contains ammonia.

FIG. 1 depicts a flowchart of sequences for ALD process 100 for depositing a material on a substrate in accordance with some embodiments described herein. ALD process 100 provides a continuous flow of a carrier gas administered into the processing chamber and exposed to a substrate therein (step 104). The substrate may optionally be exposed to a treatment gas containing a reagent (step 106). ALD process 100 includes sequentially exposing the substrate to the first precursor gas (step 108) and a second precursor gas (step 110). In one embodiment, the substrate may be exposed to the treatment gas, such as in step 106, prior to the ALD cycle of step 108 and 110. In another embodiment, the substrate may be continuously exposed to the treatment gas during the ALD cycle. In another embodiment, the substrate may be periodically exposed to the treatment gas during the ALD cycle. In one example, a tantalum nitride material may be deposited on the substrate.

At step 102, the processing chamber may be heated and pressurized to a predetermined temperature and pressure. The substrate and the substrate pedestal may also be heated to predetermined temperatures. An exemplary temperature of the processing chamber, the substrate, and/or the substrate pedestal during the treatment process and the deposition process may be within a range from about 100° C. to about 500° C., preferably, from about 200° C. to about 400° C., and more preferably, from about 250° C. to about 300° C. The processing chamber may contain a chamber body and a chamber lid, which each may independently be heated to a temperature within a range from about 25° C. to about 300° C., preferably, from about 30° C. to about 100° C., and more preferably, from about 40° C. to about 80° C. In one example, the processing chamber may have an internal pressure within a range from about 1 mTorr to about 100 Torr, preferably, from about 1 Torr to about 50 Torr, and more preferably, from about 5 Torr to about 20 Torr, such as about 10 Torr.

The substrate may be exposed to a continuous flow of a carrier gas administered into the processing chamber at step 104 of ALD process 100. The carrier gas may have a gas flow rate within a range from about 0.5 slm to about 20 slm, preferably, from about 1 slm to about 16 slm, and more preferably, from about 2 slm to about 8 slm, such as about 4 slm during step 104.

The substrate may be optionally exposed to a treatment gas during a treatment process at step 106 of ALD process 100. In one embodiment, the treatment gas may be administered, delivered, or pulsed into the processing chamber and/or the continuous flow of a carrier gas within the processing chamber. The substrate may be continuously or periodically/discontinuously exposed to the treatment gas. In one example, the treatment process provides exposing the substrate to a treatment gas containing a hydrogenated ligand compound, such as an alkylamine compound. In one example, the alkylamine compound may be methylamine, dimethylamine, or derivatives thereof.

The treatment gas containing the hydrogenated ligand compound may be exposed to the substrate with or without a carrier gas. In many examples, the treatment gas contains at least one carrier gas as well as the hydrogenated ligand compound. The carrier gas of the treatment gas may be ammonia, argon, nitrogen, hydrogen, helium, or mixtures thereof. In an alternative embodiment, such as for forming oxides or other materials, the carrier gas of the treatment gas may include oxygen, nitrous oxide, or air.

The substrate may be exposed to the treatment gas having a gas flow rate within a range from about 0.5 slm to about 20 slm, preferably, from about 1 slm to about 16 slm, and more preferably, from about 2 slm to about 8 slm, such as about 4 slm during step 106. The treatment gas may formed by flowing the carrier gas through an ampoule or a bubbler containing the hydrogenated ligand compound. Alternatively, the treatment gas may formed by co-flowing the hydrogenated ligand compound with the carrier gas. The hydrogenated ligand compound may have a gas flow rate within a range from about 5 sccm to about 1,000 sccm, preferably, from about 25 sccm to about 500 sccm, and more preferably, from about 50 sccm to about 150 sccm, such as about 100 sccm. In one example, the treatment gas contains an alkylamine compound, such as methylamine, dimethylamine, or derivatives thereof, as well as at least one carrier gas. In one example, the treatment gas may contain dimethylamine with a flow rate of about 100 sccm and argon with a flow rate of about 4 slm. In another example, the treatment gas may contain dimethylamine with a flow rate of about 20 sccm, ammonia with a flow rate of about 1 slm, and argon with a flow rate of about 8 slm. The processing chamber and/or substrate may be exposed to the treatment gas containing the hydrogenated ligand or other reagent for a time period within a range from about 2 seconds to about 120 seconds, preferably, from about 5 seconds to about 60 seconds, for example, about 20 seconds or about 40 seconds.

In step 108, a pulse of a first chemical precursor is administered into the processing chamber, pulsed into the stream of carrier gas, and adsorbed on the substrate surface. In one example, a tantalum precursor is pulsed into the stream of carrier gas and a monolayer of a tantalum precursor is adsorbed on the substrate. Any remnants of the first chemical precursor may be removed by the continuous flow of the purge gas and/or evacuation of an attached vacuum system.

The substrate is continuously exposed to the carrier gas and a pulse of a second chemical precursor is added into the carrier gas during step 110. In one example, the second chemical precursor is a nitrogen precursor. The second chemical precursor reacts with the adsorbed layer of the first chemical precursor to form a deposited layer of material on the substrate. In one example, the second chemical precursor is a nitrogen precursor. The nitrogen precursor, such as ammonia, reacts with the adsorbed layer of the first chemical precursor, such as the tantalum precursor, to form a tantalum nitride layer on the substrate. Any remnants of the second chemical precursor and any by-products (e.g., organic compounds) may be removed by the continuous flow of the purge gas and/or evacuation of the attached vacuum system.

In embodiments described herein, the treatment gas may optionally be administered, delivered, or pulsed into the stream of carrier gas, the tantalum precursor, and/or the nitrogen precursor while exposing the substrate prior to, during, or after steps 108 and/or 110. Alternatively, the treatment gas may optionally be administered, delivered, or pulsed independently into the processing chamber to expose the substrate prior to, during, or after steps 108 and/or 110. Therefore, the substrate may be continuously or periodically exposed to the treatment gas during any of the steps of ALD process 100. In one example, the substrate is exposed to the treatment gas containing a hydrogenated ligand compound, preferably, an alkylamine compound, such as methylamine, dimethylamine, or derivatives thereof during any of steps 106, 108, and/or 110.

The deposition rate of the material being deposited may be controlled by varying the amount of treatment gas exposed to the substrate during any of steps 106, 108, and/or 110. Therefore, the deposition rate may be adjusted, such as within a range from about 0.05 Å/cycle (Å per ALD cycle) to about 1.0 Å/cycle. In one example, the deposition rate of the deposited material is about 0.5 Å/cycle.

In other examples, the deposition rate of the deposited material on the substrate may be controlled or reduced by exposing the substrate to the treatment gas prior to or during each ALD cycle of ALD process 100. The deposition rate of the deposited material may be reduced by about 95% or less, relative to depositing the material by the same ALD process without exposing the substrate to the treatment gas. In one embodiment, the material may be deposited on the substrate in the absence of the treatment gas at a first deposition rate during an ALD process and in the presence of the treatment gas at a second deposition rate during any of steps 106, 108, and/or 110 of the ALD process 100. In one example, the second deposition rate may be about 95%, or less of the first deposition rate. In another example, the second deposition rate may be about 90%, or less of the first deposition rate. In another example, the second deposition rate may be about 80%, or less of the first deposition rate. In another example, the second deposition rate may be about 70%, or less of the first deposition rate. In another example, the second deposition rate may be about 60%, or less of the first deposition rate. In another example, the second deposition rate may be about 50%, or less of the first deposition rate. In another example, the second deposition rate may be within a range from about 0.05 Å/cycle to about 1.0 Å/cycle, such as about 0.5 Å/cycle.

At step 112, if the desired thickness of the deposited material has been achieved, then the deposition process is ended at step 114. However, multiple ALD cycles of steps 106-112 are generally repeated before achieving the desired thickness of the deposited material. In one example, PDMAT and ammonia are sequentially pulsed for 40 cycles and the substrate is continuously exposed to DMA while depositing a tantalum nitride material with a thickness about 20 Å. In another example, PDMAT and ammonia are sequentially pulsed for 40 cycles and the substrate is discontinuously exposed to DMA while depositing a tantalum nitride material with a thickness about 20 Å.

In an alternative embodiment, ALD process 100 may start with the adsorption of a monolayer of the second chemical precursor (e.g., a nitrogen precursor) on the substrate followed by the absorption of a monolayer of the first chemical precursor (e.g., a tantalum precursor). In another embodiment, ALD process 100 may start with the adsorption of a monolayer of the treatment gas and subsequently, sequential monolayers of the tantalum and nitrogen precursors on the substrate. Furthermore, in other examples, a pump evacuation alone between pulses of reactant gases and/or purge gases may be used to prevent mixing of the reactant gases.

In some examples, the PDMAT precursor may be heated within an ampoule, a vaporizer, a bubbler, or a similar container prior to flowing into an ALD processing chamber. The PDMAT may be heated to a temperature at least 30° C., preferably within a range from about 45° C. to about 90° C., more preferably from about 50° C. to about 80° C., such as about 73° C. The preheated PDMAT precursor is retained in the carrier gas more thoroughly than if the PDMAT precursor was at room temperature (about 20° C.). In order to heat the PDMAT precursor to a desired temperature, the ampoule, delivery lines, and valves on the ampoule and/or delivery lines may each be independently heated to a temperature within a range from about 25° C. to about 300° C., preferably, from about 50° C. to about 150° C., and more preferably, from about 70° C. to about 120° C. In one example, the sidewalls of the ampoule may be heated to about 85° C., the delivery lines may be heated to about 100° C., and the valves may be heated to about 95° C.

In some embodiments, during the treatment process and the deposition process, the processing chamber and the substrate may be maintained approximately below a thermal decomposition temperature of the selected chemical precursor, such as the tantalum precursor PDMAT during a process to deposit a tantalum nitride material.

For clarity and ease of description, the method will be further described as it relates to the deposition of a tantalum nitride barrier layer using an ALD process. Pulses of a tantalum precursor or a tantalum-containing compound, such as PDMAT may be introduced into the processing chamber. The tantalum precursor may be provided with the aid of a carrier gas or purge gas, which includes, but is not limited to, helium, argon, nitrogen, hydrogen, forming gas, or mixtures thereof. Pulses of a nitrogen precursor or a nitrogen-containing compound, such as ammonia, are also introduced into the processing chamber. A carrier gas may be used to deliver the nitrogen precursor. In one aspect, the flow of purge gas may be continuously provided by a gas sources (e.g., tank or in-house) to act as a purge gas between the pulses of the tantalum precursor and of the nitrogen precursor and to act as a carrier gas during the pulses of the tantalum precursor and the nitrogen precursor. In other aspects, a pulse of purge gas may be provided after each pulse of the tantalum precursor and each pulse the nitrogen precursor. Also, a constant purge or carrier gas may be flowing through the processing chamber during each of the deposition steps or half reactions.

In one example, the substrate may be heated to a temperature within a range from about 250° C. to about 300° C. and the internal pressure of the chamber may be within a range from about 5 Torr to about 15 Torr. The substrate may be exposed to an argon carrier gas having a flow rate within a range from about 1,000 sccm to about 3,000 sccm, preferably about 1,500 sccm.

A tantalum precursor gas may be formed by flowing a carrier gas, such as argon, through the ampoule of preheated PDMAT a rate from about 200 sccm to about 2,000 sccm, for example, about 500 sccm. The PDMAT is maintained at about 73° C. A tantalum precursor gas containing PDMAT and argon may be administered to the substrate surface for a period of time within a range from about 0.1 seconds to about 3.0 seconds, preferably, from about 0.5 seconds to about 1.5 seconds, for example, about 1 second.

In some examples, the substrate is continuously exposed to a treatment gas containing DMA while being exposed to the tantalum precursor gas containing PDMAT. In other examples, the substrate is periodically exposed to a treatment gas containing DMA while being exposed to the tantalum precursor gas containing PDMAT. In other examples, the substrate is exposed to a treatment gas containing DMA prior to being exposed to the tantalum precursor gas containing PDMAT. The treatment gas containing DMA and the tantalum precursor gas containing PDMAT may be independently flowed or co-flowed into the processing chamber and may be independently exposed or simultaneously exposed to the substrate.

After the substrate is exposed to a pulse of PDMAT, the flow of carrier gas may continue to purge for a period of time within a range from about 0.2 seconds to about 5.0 seconds, preferably, from about 0.25 seconds to about 1.5 seconds, for example, about 0.5 seconds. The attached vacuum system removes any remaining PDMAT during this purge step.

Subsequently, a pulse of a nitrogen precursor gas containing ammonia is administered to the substrate surface. The nitrogen precursor gas may include the nitrogen precursor in a carrier gas or may be solely the nitrogen precursor. In one example, the nitrogen precursor gas contains ammonia and nitrogen. The nitrogen precursor gas containing ammonia may be delivered a rate from about 1,000 sccm to about 3,000 sccm, preferably about 1,500 sccm and may be administered to the substrate surface for a period of time within a range from about 0.1 seconds to about 3.0 seconds, preferably, from about 0.5 seconds to about 1.5 seconds, for example about 1 second.

In some examples, the substrate is continuously exposed to the treatment gas containing DMA while being exposed to the nitrogen precursor gas containing ammonia. In other examples, the substrate is periodically exposed to the treatment gas containing DMA while being exposed to the nitrogen precursor gas containing ammonia. In other examples, the substrate is exposed to the treatment gas containing DMA prior to being exposed to the nitrogen precursor gas containing ammonia. The treatment gas containing DMA and the nitrogen precursor gas containing ammonia may be independently flowed or co-flowed into the processing chamber and may be independently exposed or simultaneously exposed to the substrate.

After the pulse of the nitrogen precursor gas containing ammonia, the flow of the carrier gas may continue for a period of time within a range from about 0.2 seconds to about 5.0 seconds, preferably, from about 0.25 seconds to about 1.5 seconds, for example, about 0.5 seconds. The vacuum system removes any remaining nitrogen precursor and/or any by-products formed during the reaction.

The ALD cycle may be repeated until a predetermined thickness of the deposited material, such as tantalum nitride, is achieved, such as within a range from about 5 Å to about 200 Å, preferably, from about 10 Å to about 30 Å, such as about 20 Å for a barrier layer.

The time duration for each pulse of tantalum precursor gas, pulse of the nitrogen precursor gas, and pulse of purge gas between pulses of the reactants are variable and depend on the volume capacity of a deposition chamber employed as well as a vacuum system coupled thereto. For example, (1) a lower chamber pressure of a gas will require a longer pulse time, (2) a lower gas flow rate will require a longer time for chamber pressure to rise and stabilize requiring a longer pulse time, and (3) a large-volume chamber will take longer to fill, longer for chamber pressure to stabilize thus requiring a longer pulse time. Similarly, time between each pulse is also variable and depends on volume capacity of the processing chamber as well as the vacuum system coupled thereto. In general, the time duration of a pulse of the tantalum precursor gas or the nitrogen precursor gas should be long enough for adsorption or reaction of a monolayer of the compound. In one aspect, a pulse of a tantalum precursor gas may still be in the processing chamber when a pulse of a nitrogen precursor gas enters. The treatment gas may still be in the processing chamber along with the pulse of the tantalum precursor gas and/or the pulse of the nitrogen precursor gas. In general, the duration of the purge gas and/or pump evacuation should be long enough to prevent the pulses of the tantalum precursor gas and the nitrogen precursor gas from mixing together in the reaction zone.

In another embodiment, the substrate may be exposed to the treatment gas prior to or during the deposition of other materials on a substrate. In one example, the hydrogenated ligand compound may be an alkylamine compound, such as methylamine or dimethylamine, while PDMAT may be used as a tantalum precursor to form other tantalum-containing material, such as tantalum oxide, tantalum silicon nitride, tantalum boron nitride, tantalum phosphorous nitride, tantalum oxynitride, or tantalum silicate. A more detailed description of a process to form ternary or quaternary elemental tantalum-containing materials is described in commonly assigned U.S. Pat. No. 7,081,271, which is herein incorporated by reference in its entirety.

Process 100 may be modified in order to obtain other tantalum-containing materials. For example, the substrate may be exposed to the treatment gas prior to or during the deposition of a tantalum silicon nitride material, which may be formed if the substrate is exposed to a pulse of a silicon precursor as an additional step of the ALD cycle containing the pulses of the tantalum precursor gas and a nitrogen precursor. Similar, the substrate may be exposed to the treatment gas prior to or during the deposition of a tantalum oxynitride material, which may be formed if the substrate is exposed to a pulse of an oxygen precursor as an additional step of the ALD cycle containing the pulses of the tantalum precursor gas and a nitrogen precursor. In another example, the substrate may be exposed to the treatment gas prior to or during the deposition of a tantalum silicate material, which may be formed if the substrate is exposed to a pulse of the tantalum precursor gas, a pulse of a silicon precursor, and a pulse of an oxygen precursor during the ALD cycle. In another example, the substrate may be exposed to the treatment gas prior to or during the deposition of a tantalum oxide material, which may be formed if the substrate is exposed to a pulse of the tantalum precursor gas and a pulse of an oxygen precursor during the ALD cycle. In another example, the substrate may be exposed to the treatment gas prior to or during the deposition of a tantalum phosphorous nitride material, which may be formed if the substrate is exposed to a pulse of the tantalum precursor gas, a pulse of a nitrogen precursor and a pulse of a phosphorous precursor (e.g., phosphine) during the ALD cycle. In another example, the substrate may be exposed to the treatment gas prior to or during the deposition of a tantalum boron nitride material, which may be formed if the substrate is exposed to a pulse of the tantalum precursor gas, a pulse of a nitrogen precursor and a pulse of a boron precursor (e.g., diborane) during the ALD cycle.

In one embodiment, the substrate may be exposed to the treatment gas prior to or during the deposition of a tantalum nitride material, which may be formed or deposited with the chemical formula of $TaN_x$, where x is within a range from about 0.4 to about 2.0. In some examples, the tantalum nitride materials may be formed with empirical formulas of TaN, $Ta_3N_5$, $Ta_2N$, or $Ta_6N_{2.57}$. The tantalum nitride materials may be deposited as amorphous or crystalline materials. The ALD process provides stoichiometric control during the deposition of the tantalum nitride materials. The stoichiometry may be altered by various procedures following the deposition process, such as when $Ta_3N_5$ is thermally annealed to form TaN. The ratio of the precursors may be altered during deposition to control the stoichiometry of the tantalum nitride materials.

In the examples above, the various tantalum materials, such as tantalum nitride, may be formed by ALD processes which utilize the tantalum precursor PDMAT, the nitrogen precursor ammonia, and a treatment gas containing a hydrogenated ligand compound, such as dimethylamine. However, other chemical precursors and hydrogenated ligand compounds are within the scope of embodiments described herein.

An important characteristic for a chemical precursor used in a vapor deposition process is to have a favorable vapor pressure. The chemical precursor may have a gaseous state, a liquid state, or a solid state at ambient temperature and/or pressure. However, within the vapor deposition system, precursors are volatilized to a gas and delivered to the ALD or CVD processing chamber. The chemical precursors are usually heated prior to being delivered into the processing chamber.

Tantalum precursors may contain ligands such as alkylamino, alkylimino, cyclopentadienyl, alkylcyclopentadienyl, pentadienyl, alkyl, alkene, alkyne, alkoxyl, isomers thereof, derivatives thereof, or combinations thereof. Alkylamino tantalum compounds used as tantalum precursors include $(RR'N)_5Ta$, where each of R or R' is independently hydrogen, methyl, ethyl, propyl, or butyl. Alkylimino tantalum compounds used as tantalum precursors include (RN) $(R'R''N)_3Ta$, where each of R, R', or R'' is independently hydrogen, methyl, ethyl, propyl, butyl, or pentyl(amyl).

Exemplary tantalum precursors include pentakis(dimethylamino) tantalum (PDMAT, $(Me_2N)_5Ta$), pentakis(diethylamino) tantalum (PDEAT, $(Et_2N)_5Ta$), pentakis(ethylmethylamino) tantalum (PEMAT, $(EtMeN)_5Ta$), tert-butylimino tris(dimethylamino) tantalum (TBTDMT, $(^tBuN)Ta(NMe_2)_3$), tert-butylimino tris(diethylamino) tantalum (TBTDET, $(^tBuN)Ta(NEt_2)_3$), tert-butylimino tris(ethylmethylamino) tantalum (TBTEMT, $(^tBuN)Ta(NMeEt)_3$), tert-amylimino-tris(dimethylamino) tantalum (TAIMATA, $(^tAmylN)Ta(NMe_2)_3$), tert-amylimino-tris(diethylamino) tantalum $((^tAmylN)Ta(NEt_2)_3)$, tert-amylimino-tris(ethylmethylamino) tantalum $((^tAmylN)Ta(NEtMe)_3)$, bis(cyclopentadienyl) tantalum trihydride $(Cp_2TaH_3)$, bis(methylcyclopentadienyl) tantalum trihydride $((MeCp)_2TaH_3)$, bis(pentamethylcyclopentadienyl) tantalum trihydride $((Me_5Cp)_2TaH_3)$, tantalum methoxide $((MeO)_5Ta)$, tantalum ethoxide $((EtO)_5Ta)$, tantalum propoxide $((PrO)_5Ta)$, tantalum butoxide $((BuO)_5Ta)$, isomers thereof, or derivatives thereof.

"TAIMATA" is used herein to describe tertiaryamyliminotris(dimethylamino) tantalum with the chemical formula $(^tAmylN)Ta(NMe_2)_3$, wherein $^tAmyl$ is the tertiaryamyl(tert-amyl) group ($C_5H_{11}$— or $CH_3CH_2C(CH_3)_2$—). In one embodiment, a tantalum precursor gas may be formed by heating a liquid TAIMATA precursor in a vaporizer, a bubbler or an ampoule to a temperature of at least 30° C., preferably to a temperature within a range from about 50° C. to about 80° C. A carrier gas may be flown across or bubbled through the heated TAIMATA to form a tantalum precursor gas.

Besides tantalum precursors, other chemical precursors may also be used in vapor deposition processes, as described by embodiments herein. Exemplary chemical precursors that may also be used in vapor deposition (e.g., ALD or CVD) processes include titanium precursors, tungsten precursors, hafnium precursors, zirconium precursors, aluminum precursors, cobalt precursors, ruthenium precursors, copper precursors, silicon precursors, nitrogen precursors, oxygen precursors, as well as other chemical precursors. Materials that may be formed or deposited include a variety of metals, nitrides, oxides, silicides, including metallic tantalum, tantalum nitride, tantalum oxide, tantalum oxynitride, tantalum silicide, tantalum silicide nitride, metallic titanium, titanium nitride, titanium oxide, titanium oxynitride, titanium silicide, titanium silicide nitride, metallic tungsten, tungsten nitride, tungsten oxide, tungsten boronitride, tungsten silicide, tungsten silicide nitride, tungsten boride, metallic hafnium, hafnium nitride, hafnium oxide, hafnium oxynitride, hafnium silicide, hafnium silicon nitride, hafnium silicate, hafnium silicon oxynitride, metallic zirconium, zirconium nitride, zirconium oxide, zirconium oxynitride, zirconium silicide, zirconium silicon nitride, zirconium silicate, zirconium silicon oxynitride, metallic aluminum, aluminum nitride, aluminum oxide, aluminum oxynitride, aluminum silicide, aluminum silicon nitride, aluminum silicate, aluminum silicon oxynitride, metallic cobalt, cobalt silicide, metallic ruthenium, metallic copper, copper alloys, derivatives thereof, alloys thereof, or combinations thereof.

In another embodiment, the treatment gas contains a hydrogenated ligand compound having the chemical formula of HL, where L is a ligand such as alkylamino, alkylimino, alkoxy, alkyl, alkene, alkyne, cyclopentadienyl, alkylcyclopentadienyl, pentadienyl, pyrrolyl, or derivatives thereof. In some examples, such as when the metal precursor is an alkylamino metal precursor, the treatment gas contains a hydrogenated ligand compound which may be an alkylamine compound having the chemical formula of $H_2NR$ or $HNR'R''$, where each R, R', and R'' is independently methyl, ethyl, propyl, butyl, amyl, phenyl, aryl, isomers thereof, derivatives thereof, or combinations thereof. The alkylamine compound may be methylamine, dimethylamine, ethylamine, diethylamine, methylethylamine, propylamine, dipropylamine, butylamine, dibutylamine, isomers thereof, derivatives thereof, or combinations thereof. In some examples, the treatment gas further contains at least one carrier gas such as ammonia, hydrogen, nitrogen, argon, helium, or combinations thereof. In one example, the treatment gas contains dimethylamine, ammonia, and another carrier gas, such as argon.

In other examples, the treatment gas contains a hydrogenated ligand compound which may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In other examples, the chemical precursor contains an alkoxy ligand such as $OCH_3$, $OC_2H_5$, $OC_3H_7$, $OC_4H_9$, isomers thereof, or derivatives thereof.

In other embodiments, the precursor gas contains a chemical precursor having the chemical formula of $ML'_x$, where x is 1, 2, 3, 4, 5, 6, or greater, M is an element such as Ti, Zr, Hf, Nb, Ta, Mo, W, Ru, Co, Ni, Pd, Pt, Cu, Al, Ga, In, Si, Ge, Sn, P, As, or Sb, and each L' is independently a ligand such as alkylamino, alkylimino, alkoxy, alkyl, alkene, alkyne, cyclopentadienyl, alkylcyclopentadienyl, pentadienyl, pyrrolyl, hydrogen, halogen, derivatives thereof, or combinations thereof.

In one embodiment, the ligand L of the hydrogenated ligand compound may be cyclopentadienyl, alkylcyclopentadienyl, pentadienyl, pyrrolyl, isomers thereof, or derivatives thereof and the ligand L' of the chemical precursor may be cyclopentadienyl, alkylcyclopentadienyl, pentadienyl, pyrrolyl, isomers thereof, or derivatives thereof.

In some examples, the precursor gas contains the alkylamino metal precursor gas contains an alkylamino metal precursor having the chemical formula of $ML'_x$, where x is 1, 2, 3, 4, 5, 6, or greater, M may be a metal or other element such as Ti, Zr, Hf, Ta, Mo, W, or Si, and each ligand L' is independently a ligand, such as an alkylamino ligand, which include $N(CH_3)_2$, $N(C_2H_5)_2$, $N(C_3H_7)_2$, $N(C_4H_9)_2$, $N(CH_3)(C_2H_5)$, isomers thereof, derivatives thereof, or combinations thereof. In some examples, metal/element M may be Si, Ti, Zr, or Hf while x is usually 4. In other examples, the alkylamino metal precursor is a tantalum precursor with metal M being Ta while x is usually 4 or 5.

In other examples, the hydrogenated ligand compound may be an alcohol compound having the chemical formula of ROH, where R is methyl, ethyl, propyl, butyl, amyl, isomers thereof, or derivatives thereof. The alcohol compound may be methanol, ethanol, propanol, butanol, pentanol, isomers thereof, derivatives thereof, or combinations thereof. In other examples, the first precursor contains an alkoxy ligand such as $OCH_3$, $OC_2H_5$, $OC_3H_7$, $OC_4H_9$, isomers thereof, or derivatives thereof. In other examples, the ligand L of the hydrogenated ligand compound may be cyclopentadienyl, alkylcyclopentadienyl, pentadienyl, pyrrolyl, isomers thereof, or derivatives thereof and the ligand L' of the first precursor may be cyclopentadienyl, alkylcyclopentadienyl, pentadienyl, pyrrolyl, isomers thereof, or derivatives thereof.

Titanium precursors useful for depositing materials as described herein include tetrakis(dimethylamino) titanium (TDMAT), tetrakis(ethylmethylamino) titanium (TEMAT), tetrakis(diethylamino) titanium (TDEAT), or derivatives thereof.

Tungsten precursors useful for depositing materials as described herein include bis(tert-butylimino)-bis(dimethylamino) tungsten (($^t$BuN)$_2$W(NMe$_2$)$_2$), bis(tert-butylimino)-bis(diethylamino) tungsten (($^t$BuN)$_2$W(NEt$_2$)$_2$), bis(tert-butylimino)-bis(ethylmethylamino) tungsten (($^t$BuN)$_2$W(NEtMe)$_2$), or derivatives thereof.

Hafnium alkylamino compounds useful as hafnium precursors include $(RR'N)_4Hf$, where each R and R' is independently hydrogen, methyl, ethyl, propyl, butyl, amyl, or isomers thereof. Hafnium precursors useful for depositing materials as described herein include tetrakis(diethylamino) hafnium ((Et$_2$N)$_4$Hf, TDEAH), tetrakis(dimethylamino) hafnium ((Me$_2$N)$_4$Hf, TDMAH), tetrakis(ethylmethylamino) hafnium ((EtMeN)$_4$Hf, TEMAH), hafnium tetramethoxide ((MeO)$_4$Hf), hafnium tetraethoxide ((EtO)$_4$Hf), hafnium tetrapropoxide ((PrO)$_4$Hf), hafnium tetrabutoxide ((BuO)$_4$Hf), isomers thereof, or derivatives thereof. Other hafnium precursors may include hafnium chloride (HfCl$_4$), hafnium iodide (HfI$_4$), ($^t$BuC$_5$H$_4$)$_2$HfCl$_2$, (C$_5$H$_5$)$_2$HfCl$_2$, (EtC$_5$H$_4$)$_2$HfCl$_2$, (Me$_5$C$_5$)$_2$HfCl$_2$, (Me$_5$C$_5$)HfCl$_3$, ($^i$PrC$_5$H$_4$)$_2$HfCl$_2$, ($^i$PrC$_5$H$_4$)HfCl$_3$, ($^t$BuC$_5$H$_4$)$_2$HfMe$_2$, (acac)$_4$Hf, (hfac)$_4$Hf, (tfac)$_4$Hf, (thd)$_4$Hf, (NO$_3$)$_4$Hf, or derivatives thereof.

Zirconium alkylamino compounds useful as zirconium precursors include $(RR'N)_4Zr$, where each R and R' is independently hydrogen, methyl, ethyl, propyl, butyl, amyl, or isomers thereof. Zirconium precursors useful for depositing materials as described herein include tetrakis(diethylamino) zirconium ((Et$_2$N)$_4$Zr), tetrakis(dimethylamino) zirconium ((Me$_2$N)$_4$Zr), tetrakis(ethylmethylamino) zirconium ((EtMeN)$_4$Zr), zirconium tetramethoxide ((MeO)$_4$Zr), zirconium tetraethoxide ((EtO)$_4$Zr), zirconium tetrapropoxide ((PrO)$_4$Zr), zirconium tetrabutoxide ((BuO)$_4$Zr), isomers thereof, or derivatives thereof. Other zirconium precursors may include zirconium chloride (ZrCl$_4$), zirconium iodide (ZrI$_4$), ($^t$BuC$_5$H$_4$)$_2$ZrCl$_2$, (C$_5$H$_5$)$_2$ZrCl$_2$, (EtC$_5$H$_4$)$_2$ZrCl$_2$, (Me$_5$C$_5$)$_2$ZrCl$_2$, (Me$_5$C$_5$)ZrCl$_3$, ($^i$PrC$_5$H$_4$)$_2$ZrCl$_2$, ($^i$PrC$_5$H$_4$)ZrCl$_3$, ($^t$BuC$_5$H$_4$)$_2$ZrMe$_2$, (acac)$_4$Zr, (Zrac)$_4$Zr, (tfac)$_4$Zr, (thd)$_4$Zr, (NO$_3$)$_4$Zr, or derivatives thereof.

Aluminum precursors useful for depositing materials as described herein include aluminum methoxide ((MeO)$_3$Al), aluminum ethoxide ((EtO)$_3$Al), aluminum propoxide ((PrO)$_3$Al), aluminum butoxide ((BuO)$_3$Al), or derivatives thereof.

Silicon precursors useful for depositing materials as described herein include silane compounds, alkylamino silane compounds, silanol, or alkoxysilane compounds, as well as other silicon containing compounds. Alkylamino silane compounds useful as silicon precursors include $(RR'N)_{4-n}SiH_n$, where R or R' are independently hydrogen, methyl, ethyl, propyl, butyl, amyl, isomers thereof, or derivatives thereof and n is 0, 1, 2, or 3. Alkoxy silane compounds may be described by the generic chemical formula $(RO)_{4-n}SiL_n$, where R is methyl, ethyl, propyl, butyl, amyl, isomers thereof, or derivatives thereof and L is H, OH, F, Cl, Br, I, methyl, ethyl, propyl, butyl, or mixtures thereof, and n is 0, 1, 2, or 3. Silicon precursors may include tetrakis(dimethylamino) silane ((Me$_2$N)$_4$Si, DMAS), tris(dimethylamino) silane ((Me$_2$N)$_3$SiH, Tris-DMAS), bis(dimethylamino) silane ((Me$_2$N)$_2$SiH$_2$), dimethylamino silane ((Me$_2$N)SiH$_3$), tetrakis(diethylamino) silane ((Et$_2$N)$_4$Si)), tris(diethylamino) silane ((Et$_2$N)$_3$SiH), tetrakis(methylethylamino) silane ((MeEtN)$_4$Si), tris(methylethylamino) silane ((MeEtN)$_3$SiH), tetramethoxysilane ((MeO)$_4$Si), tetraethoxysilane ((EtO)$_4$Si), isomers thereof, derivatives thereof, or combinations thereof. Other silicon precursors that may be used in vapor deposition processes described herein include silane (SiH$_4$), disilane (Si$_2$H$_6$), tetrachlorosilane (SiCl$_4$), hexachlorodisilane (Si$_2$Cl$_6$), tetraisocyanate silane (Si(NCO)$_4$), trisocyanate methylsilane (MeSi(NCO)$_3$), or derivatives thereof.

In another embodiment, a family of ruthenium precursors useful to form a ruthenium material during the deposition process described herein includes pyrrolyl ruthenium precursors. During a treatment process of the processing chamber and/or the substrate, the hydrogenated ligand compound within the treatment gas may be a hydrogenated pyrrolyl ligand, pyridine, or derivatives thereof. In one example, a pyrrolyl ruthenium precursor contains ruthenium and at least one pyrrolyl ligand or at least one pyrrolyl derivative ligand. A pyrrolyl ruthenium precursor may have a pyrrolyl ligand, such as, for example:

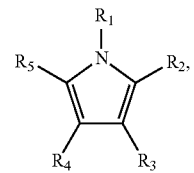

where $R_1$, $R_2$, $R_3$, $R_4$, and $R_5$ is each independently absent, hydrogen, an alkyl group (e.g., methyl, ethyl, propyl, butyl, amyl, or higher), an amine group, an alkoxy group, an alcohol group, an aryl group, another pyrrolyl group (e.g., 2,2'-bipyrrolyl), a pyrazole group, derivatives thereof, or combinations thereof. The pyrrolyl ligand may have any two or more of $R_1$, $R_2$, $R_3$, $R_4$, and $R_5$ connected together by a chemical group. For example, $R_2$ and $R_3$ may be a portion of a ring structure such as an indolyl group or derivative thereof. A pyrrolyl ruthenium precursor as used herein refers to any chemical compound containing ruthenium and at least one pyrrolyl ligand or at least one derivative of a pyrrolyl ligand. In some examples, a pyrrolyl ruthenium precursor may include bis (tetramethylpyrrolyl)ruthenium, bis(2,5-dimethylpyrrolyl) ruthenium, bis(2,5-diethylpyrrolyl)ruthenium, bis(tetraethylpyrrolyl)ruthenium, pentadienyl tetramethylpyrrolyl ruthenium, pentadienyl 2,5-dimethylpyrrolyl ruthenium, pentadienyl tetraethylpyrrolyl ruthenium, pentadienyl 2,5-diethylpyrrolyl ruthenium, 1,3-dimethylpentadienyl pyrrolyl ruthenium, 1,3-diethylpentadienyl pyrrolyl ruthenium, methylcyclopentadienyl pyrrolyl ruthenium, ethylcyclopentadienyl pyrrolyl ruthenium, 2-methylpyrrolyl pyrrolyl ruthenium, 2-ethylpyrrolyl pyrrolyl ruthenium, or derivatives thereof.

A pyrrolyl ligand, as used herein, may be abbreviated by "py" and a pyrrolyl derivative ligand may be abbreviated by "R-py." Exemplary pyrrolyl ruthenium precursors useful to form a ruthenium material during the deposition process described herein include alkyl pyrrolyl ruthenium precursors (e.g., (Rx-py)Ru), bis(pyrrolyl)ruthenium precursors (e.g., (py)$_2$Ru) and dienyl pyrrolyl ruthenium precursors (e.g., (Cp)(py)Ru). Examples of alkyl pyrrolyl ruthenium precursors include methylpyrrolyl ruthenium, ethylpyrrolyl ruthenium, propylpyrrolyl ruthenium, dimethylpyrrolyl ruthenium, diethylpyrrolyl ruthenium, dipropylpyrrolyl ruthenium, trimethylpyrrolyl ruthenium, triethylpyrrolyl ruthenium, tetramethylpyrrolyl ruthenium, tetraethylpyrrolyl ruthenium, or derivatives thereof. Examples of bis(pyrrolyl)ruthenium precursors include bis(pyrrolyl)ruthenium, bis(methylpyrrolyl) ruthenium, bis(ethylpyrrolyl)ruthenium, bis(propylpyrrolyl) ruthenium, bis(dimethylpyrrolyl)ruthenium, bis (diethylpyrrolyl)ruthenium, bis(dipropylpyrrolyl)ruthenium, bis(trimethylpyrrolyl)ruthenium, bis(triethylpyrrolyl)ruthenium, bis(tetramethylpyrrolyl)ruthenium, bis(tetraethylpyrrolyl)ruthenium, methylpyrrolyl pyrrolyl ruthenium, ethylpyrrolyl pyrrolyl ruthenium, propylpyrrolyl pyrrolyl ruthenium, dimethylpyrrolyl pyrrolyl ruthenium, diethylpyrrolyl pyrrolyl ruthenium, dipropylpyrrolyl pyrrolyl ruthenium, trimethylpyrrolyl pyrrolyl ruthenium, triethylpyrrolyl pyrrolyl ruthenium, tetramethylpyrrolyl pyrrolyl ruthenium, tetraethylpyrrolyl pyrrolyl ruthenium, or derivatives thereof.

A dienyl pyrrolyl ruthenium precursor contains at least one dienyl ligand and at least one pyrrolyl ligand. The dienyl ligand may contain a carbon backbone with as little as four carbon atoms or as many as about ten carbon atoms, preferably, about five or six. The dienyl ligand may have a ring structure (e.g., cyclopentadienyl) or may be an open alkyl chain (e.g., pentadienyl). Also, dienyl ligand may contain no alkyl groups, one alkyl group, or many alkyl groups.

In one embodiment, the dienyl pyrrolyl ruthenium precursor contains a pentadienyl ligand or an alkylpentadienyl ligand. Examples of pentadienyl pyrrolyl ruthenium precursors include pentadienyl pyrrolyl ruthenium, pentadienyl methylpyrrolyl ruthenium, pentadienyl ethylpyrrolyl ruthenium, pentadienyl propylpyrrolyl ruthenium, pentadienyl dimethylpyrrolyl ruthenium, pentadienyl diethylpyrrolyl ruthenium, pentadienyl dipropylpyrrolyl ruthenium, pentadienyl trimethylpyrrolyl ruthenium, pentadienyl triethylpyrrolyl ruthenium, pentadienyl tetramethylpyrrolyl ruthenium, pentadienyl tetraethylpyrrolyl ruthenium, or derivatives thereof. Examples of alkylpentadienyl pyrrolyl ruthenium precursors include alkylpentadienyl pyrrolyl ruthenium, alkylpentadienyl methylpyrrolyl ruthenium, alkylpentadienyl ethylpyrrolyl ruthenium, alkylpentadienyl propylpyrrolyl ruthenium, alkylpentadienyl dimethylpyrrolyl ruthenium, alkylpentadienyl diethylpyrrolyl ruthenium, alkylpentadienyl dipropylpyrrolyl ruthenium, alkylpentadienyl trimethylpyrrolyl ruthenium, alkylpentadienyl triethylpyrrolyl ruthenium, alkylpentadienyl tetramethylpyrrolyl ruthenium, alkylpentadienyl tetraethylpyrrolyl ruthenium, or derivatives thereof.

In another embodiment, the dienyl pyrrolyl ruthenium precursor contains a cyclopentadienyl ligand or an alkylcyclopentadienyl ligand. Examples of cyclopentadienyl pyrrolyl ruthenium precursors include cyclopentadienyl pyrrolyl ruthenium, cyclopentadienyl methylpyrrolyl ruthenium, cyclopentadienyl ethylpyrrolyl ruthenium, cyclopentadienyl propylpyrrolyl ruthenium, cyclopentadienyl dimethylpyrrolyl ruthenium, cyclopentadienyl diethylpyrrolyl ruthenium, cyclopentadienyl dipropylpyrrolyl ruthenium, cyclopentadienyl trimethylpyrrolyl ruthenium, cyclopentadienyl triethylpyrrolyl ruthenium, cyclopentadienyl tetramethylpyrrolyl ruthenium, cyclopentadienyl tetraethylpyrrolyl ruthenium, or derivatives thereof. Examples of alkylcyclopentadienyl pyrrolyl ruthenium precursors include alkylcyclopentadienyl pyrrolyl ruthenium, alkylcyclopentadienyl methylpyrrolyl ruthenium, alkylcyclopentadienyl ethylpyrrolyl ruthenium, alkylcyclopentadienyl propylpyrrolyl ruthenium, alkylcyclopentadienyl dimethylpyrrolyl ruthenium, alkylcyclopentadienyl diethylpyrrolyl ruthenium, alkylcyclopentadienyl dipropylpyrrolyl ruthenium, alkylcyclopentadienyl trimethylpyrrolyl ruthenium, alkylcyclopentadienyl triethylpyrrolyl ruthenium, alkylcyclopentadienyl tetramethylpyrrolyl ruthenium, alkylcyclopentadienyl tetraethylpyrrolyl ruthenium, or derivatives thereof.

In another embodiment, a ruthenium precursor may contain no pyrrolyl ligand or pyrrolyl derivative ligand, but instead, contains at least one open chain dienyl ligand, such as $CH_2CRCHCRCH_2$, where R is independently an alkyl group or hydrogen. A ruthenium precursor may have two open-chain dienyl ligands, such as pentadienyl or heptadienyl. A bis(pentadienyl)ruthenium compound has a generic chemical formula $(CH_2CRCHCRCH_2)_2Ru$, where R is independently an alkyl group or hydrogen. Usually, R is independently hydrogen, methyl, ethyl, propyl or butyl. Therefore, ruthenium precursors may include bis(dialkylpentadienyl)ruthenium compounds, bis(alkylpentadienyl)ruthenium compounds, bis(pentadienyl)ruthenium compounds, or combinations thereof. Examples of ruthenium precursors include bis(2,4-dimethylpentadienyl)ruthenium, bis(2,4-diethylpentadienyl)ruthenium, bis(2,4-diisopropylpentadienyl)ruthenium, bis(2,4-ditertbutylpentadienyl)ruthenium, bis(methylpentadienyl)ruthenium, bis(ethylpentadienyl)ruthenium, bis(isopropylpentadienyl)ruthenium, bis(tertbutylpentadienyl)ruthenium, derivatives thereof, or combinations thereof. In some embodiments, other ruthenium precursors include tris(2,2,6,6-tetramethyl-3,5-heptanedionato)ruthenium, dicarbonyl pentadienyl ruthenium, ruthenium acetyl acetonate, 2,4-dimethylpentadienyl cyclopentadienyl ruthenium, bis(2,2,6,6-tetramethyl-3,5-heptanedionato) (1,5-cyclooctadiene)ruthenium, 2,4-dimethylpentadienyl methylcyclopentadienyl ruthenium, 1,5-cyclooctadiene cyclopentadienyl ruthenium, 1,5-cyclooctadiene methylcyclopentadienyl ruthenium, 1,5-cyclooctadiene ethylcyclopentadienyl ruthenium, 2,4-dimethylpentadienyl ethylcyclopentadienyl ruthenium, 2,4-dimethylpentadienyl isopropylcyclopentadienyl ruthenium, bis(N,N-dimethyl 1,3-tetramethyl diiminato) 1,5-cyclooctadiene ruthenium, bis (N,N-dimethyl 1,3-dimethyl diiminato) 1,5-cyclooctadiene ruthenium, bis(allyl) 1,5-cyclooctadiene ruthenium, $\eta^6$-$C_6H_6$ 1,3-cyclohexadiene ruthenium, bis(1,1-dimethyl-2-aminoethoxylato) 1,5-cyclooctadiene ruthenium, bis(1,1-dimethyl-2-aminoethylaminato) 1,5-cyclooctadiene ruthenium, bis (cyclopentadienyl)ruthenium, bis(methylcyclopentadienyl) ruthenium, bis(ethylcyclopentadienyl)ruthenium, and bis (pentamethylcyclopentadienyl)ruthenium, or derivatives thereof.

Cobalt precursors useful for depositing materials as described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some embodiments, cobalt materials may be deposited by CVD and ALD processes further described in commonly assigned U.S. Pat. Nos. 7,1164,846 and 7,404, 985, which are herein incorporated by reference.

In some embodiments, cobalt carbonyl compounds or complexes may be utilized as cobalt precursors. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, butylacetylene, nitrosyl, ammonia, or derivatives thereof.

In one embodiment, dicobalt hexacarbonyl acetyl compounds may be used to form cobalt materials (e.g., cobalt layer 220) during a deposition process. Dicobalt hexacarbonyl acetyl compounds may have the chemical formula of $(CO)_6Co_2(RC\equiv CR')$, wherein R and R' are independently hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6Co_2(HC\equiv C^tBu)$) is the cobalt precursor. Other examples of dicobalt hexacarbonyl acetyl compounds include dicobalt hexacarbonyl methyl butylacetylene $((CO)_6Co_2(MeC\equiv C^tBu))$, dicobalt hexacarbonyl phenylacetylene $((CO)_6Co_2(HC\equiv CPh))$, hexacarbonyl methyl phenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene $((CO)_6Co_2(MeC\equiv CMe))$, derivatives thereof, complexes thereof, plasmas thereof, or combinations thereof. Other exemplary cobalt carbonyl complexes include cyclopentadienyl cobalt bis(carbonyl) $(CpCo(CO)_2)$, tricarbonyl allyl cobalt $((CO)_3Co(CH_2CH\equiv CH_2))$, or derivatives thereof.

In another embodiment, cobalt amidinates or cobalt amino complexes may be utilized as cobalt precursors. Cobalt amino complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amino complexes include bis(di(butyldimethylsilyl)amino) cobalt $(((BuMe_2Si)_2N)_2Co)$, bis(di(ethyldimethylsilyl)amino) cobalt $(((EtMe_2Si)_2N)_2Co)$, bis(di(propyldimethylsilyl)amino) cobalt $(((PrMe_2Si)_2N)_2Co)$, bis (di(trimethylsilyl)amino) cobalt $(((Me_3Si)_2N)_2Co)$, tris(di(trimethylsilyl)amino) cobalt $(((Me_3Si)_2N)_3Co)$, or derivatives thereof.

Some exemplary cobalt precursors include methylcyclopentadienyl cobalt bis(carbonyl) $(MeCpCo(CO)_2)$, ethylcyclopentadienyl cobalt bis(carbonyl) $(EtCpCo(CO)_2)$, pentamethylcyclopentadienyl cobalt bis(carbonyl) $(Me_5CpCo(CO)_2)$, dicobalt octa(carbonyl) $(Co_2(CO)_8)$, nitrosyl cobalt tris(carbonyl) $((ON)Co(CO)_3)$, bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis (ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

Nitrogen precursors may be used to deposit nitride or nitrogen-containing materials. Nitrogen precursors useful for depositing materials as described herein include ammonia $(NH_3)$, hydrazine $(N_2H_4)$, methyl hydrazine $((CH_3)HN_2H_2)$, dimethyl hydrazine $((CH_3)_2N_2H_2)$, t-butylhydrazine $(C_4H_9N_2H_3)$, phenylhydrazine $(C_6H_5N_2H_3)$, other hydrazine derivatives, amines, a nitrogen plasma source (e.g., $N_2$, atomic-N, $N_2/H_2$, $NH_3$, or a $N_2H_4$ plasma), 2,2'-azotertbutane $((CH_3)_6C_2N_2)$, organic or alkyl azides, such as methylazide $(CH_3N_3)$, ethylazide $(C_2H_5N_3)$, trimethylsilylazide $(Me_3SiN_3)$, inorganic azides (e.g., $NaN_3$ or $Cp_2CoN_3$) and other suitable nitrogen sources. Radical nitrogen compounds, such as $N_3$, $N_2$, N, NH, or $NH_2$, may be produced by heat, hot-wires, in situ plasma, or remote plasma. In one example, the nitrogen precursor is ammonia. In another example, the nitrogen precursor contains a nitrogen plasma formed in situ or by a remote plasma system.

Other reactive gases that may be used to deposit various materials, include tantalum nitride, tantalum-containing materials include oxygen sources and reductants. A tantalum-containing material, such as tantalum silicate, tantalum oxide, or tantalum oxynitride may be formed with the addition of an oxygen source to the vapor deposition (e.g., ALD or CVD) process. Oxygen sources or oxygen precursors include atomic-O, $O_2$, $O_3$, $H_2O$, $H_2O_2$, organic peroxides, derivatives thereof, or combinations thereof. Reducing compounds may be included in the vapor deposition process to form a tantalum precursor, such as metallic tantalum, tantalum boron nitride or tantalum phosphorous nitride. Reducing compounds include borane $(BH_3)$, diborane $(B_2H_6)$, alkylboranes (e.g., $Et_3B$), phosphine $(PH_3)$, hydrogen $(H_2)$, derivatives thereof, or combinations thereof.

A detailed description for a processing chamber, such as an ALD chamber, is described in commonly assigned U.S. Pat. No. 6,916,398, and U.S. Ser. No. 10/281,079, filed Oct. 25, 2002, and published as U.S. Pub. No. 2003-0121608, which are herein incorporated by reference in their entirety. In one embodiment, a plasma-enhanced ALD (PE-ALD) process is used to deposit tantalum materials. A chamber and process to perform PE-ALD is further described in commonly assigned U.S. Pat. No. 6,998,014, which is herein incorporated by reference in its entirety. A detailed description for a vaporizer or an ampoule to pre-heat precursors, such as PDMAT or TAIMATA, is described in commonly assigned U.S. Pat. Nos. 6,915,592 and 7,186,385, which are herein incorporated by reference in their entirety. A detailed description for a system to deliver the precursors, such as PDMAT or TAIMATA, to processing chamber is described in commonly assigned U.S. Pat. No. 6,955,211, and U.S. Ser. No. 10/700,328, filed Nov. 3, 2003, and published as U.S. Pub. No. 2005-0095859, which are herein incorporated by reference in their entirety.

Embodiments described herein provide deposition processes that may be used to deposit materials during a vapor deposition process, such as an ALD process. The processes may be used within a variety of vapor deposition processing chambers and gas delivery systems which contain an expanding channel lid assembly, a converge-diverge lid assembly, a multiple injection lid assembly, or an extended cap lid assembly. Other embodiments provide methods for depositing materials using these gas delivery systems during ALD processes.

In one embodiment, the deposition of a layer by ALD will be described in more detail in reference to the ALD of a tantalum nitride layer utilizing processes as described herein. In one aspect, ALD of a tantalum nitride barrier layer includes sequentially providing pulses of a tantalum precursor and pulses of a nitrogen precursor to the processing chamber in which each pulse is separated by a flow of a purge gas and/or chamber evacuation to remove any excess reactants to prevent gas phase reactions of the tantalum precursor with the nitrogen precursor and to remove any reaction by-products. Sequentially providing a tantalum precursor and a nitrogen precursor may result in the alternating absorption of monolayers of a tantalum precursor and of monolayers of a nitrogen precursor to form a monolayer of tantalum nitride on a substrate structure for each cycle of pulses. The term substrate structure is used to refer to the substrate as well as other material layers formed thereover, such as a dielectric layer.

It is believed that the adsorption processes used to adsorb the monolayer of the reactants, such as the tantalum precursor and the nitrogen precursor, are self-limiting in that only one monolayer may be adsorbed onto the surface of the substrate structure during a given pulse because the surface of the substrate structure has a finite number of sites for adsorbing the reactants. Once the finite number of sites is occupied by the reactants, such as the tantalum precursor or the nitrogen precursor, further absorption of the reactants will be blocked. The cycle may be repeated to a desired thickness of the tantalum nitride layer.

A continuous flow or a discontinuous flow of a treatment gas, such as DMA, may be introduced into the processing chamber from a gas source or ampoule through another valve. The treatment gas may be provided with the aid of a carrier gas, which includes, but is not limited to, helium, argon, nitrogen ($N_2$), hydrogen ($H_2$), or gaseous mixtures thereof. Pulses of a tantalum precursor, such as PDMAT, may be introduced by a gas source or ampoule through a valve. The tantalum precursor may be provided with the aid of a carrier gas, which includes, but is not limited to, helium, argon, nitrogen ($N_2$), hydrogen ($H_2$), or gaseous mixtures thereof. Pulses of a nitrogen precursor, such as ammonia, may be introduced by a gas source through another valve. A carrier gas may also be used to help deliver the nitrogen precursor. A purge gas, such as argon or nitrogen, may be introduced by a gas source through the same of different valves as for the tantalum and nitrogen precursors.

In one aspect, the flow of purge gas may be continuously provided by the gas source through the valves to act as a purge gas between the pulses of the tantalum precursor and of the nitrogen precursor and to act as a carrier gas during the pulses of the tantalum precursor and the nitrogen precursor. In one aspect, delivering a purge gas through two gas conduits provides a more complete purge of the reaction zone rather than a purge gas provided through either one of the gas conduits. In one aspect, a reactant gas may be delivered through a gas conduit since uniformity of flow of a reactant gas, such as a tantalum precursor or a nitrogen precursor, is not as critical as uniformity of the purge gas due to the self-limiting absorption process of the reactants on the surface of substrate structures. In other embodiments, a purge gas may be provided in pulses. In other embodiments, a purge gas may be provided in more or less than two gas flows. In other embodiments, a tantalum precursor gas may be provided in more than a single gas flow (e.g., two or more gas flows). In other embodiments, a nitrogen precursor gas may be provided in more than a single gas flow (e.g., two or more gas flows).

The tantalum nitride layer formation is described as starting with the absorption of a monolayer of a tantalum precursor on the substrate followed by a monolayer of a nitrogen precursor. Alternatively, the tantalum nitride layer formation may start with the absorption of a monolayer of a nitrogen precursor on the substrate followed by a monolayer of the tantalum precursor. Furthermore, in other embodiments, a pump evacuation alone between pulses of reactant gases may be used to prevent mixing of the reactant gases.

The time duration for each pulse of the tantalum precursor, the time duration for each pulse of the nitrogen precursor, and the duration of the purge gas flow between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the processing chamber as well as the vacuum system coupled thereto. In general, the time duration of a pulse of the tantalum precursor or the nitrogen precursor should be long enough for absorption of a monolayer of the compound. In one aspect, a pulse of a tantalum precursor may still be in the chamber when a pulse of a nitrogen precursor enters. In general, the duration of the purge gas and/or pump evacuation should be long enough to prevent the pulses of the tantalum precursor and the nitrogen precursor from mixing together in the reaction zone.

Generally, a pulse time of about 1.0 second or less for a tantalum precursor and a pulse time of about 1.0 second or less for a nitrogen precursor are typically sufficient to adsorb alternating monolayers on a substrate structure. A time of about 1.0 second or less between pulses of the tantalum precursor and the nitrogen precursor is typically sufficient for the purge gas, whether a continuous purge gas or a pulse of a purge gas, to prevent the pulses of the tantalum precursor and the nitrogen precursor from mixing together in the reaction zone. Of course, a longer pulse time of the reactants may be used to ensure absorption of the tantalum precursor and the nitrogen precursor and a longer time between pulses of the reactants may be used to ensure removal of the reaction by-products.

In one example, a processing chamber, a substrate, or a substrate support may be maintained approximately below a thermal decomposition temperature of a selected tantalum precursor during an ALD process. An exemplary heater temperature range to be used with tantalum precursors identified herein is approximately between about 20° C. and about 500° C. at a chamber pressure less than about 100 Torr, preferably less than 50 Torr. When the tantalum precursor is PDMAT, the heater temperature is preferably within a range from about 150° C. to about 350° C., more preferably, from about 250° C. and 300° C., and the internal pressure of the processing chamber may be within a range from about 5 Torr to about 20 Torr. In other embodiments, it should be understood that other temperatures and pressures may be used. For example, a temperature above a thermal decomposition temperature may be used. However, the temperature should be selected so that more than 50 percent of the deposition activity is by absorption processes. In another example, a temperature above a thermal decomposition temperature may be used in which the amount of decomposition during each precursor deposition is limited so that the growth mode will be similar to an ALD growth mode.

In one example, the processing chamber may be exposed to a treatment process and subsequently, to an ALD process. The process may provide pulses of the tantalum precursor gas (e.g., PDMAT in argon) from a gas source or ampoule and having a flow rate within a range from about 100 sccm to about 1,000 sccm, preferably, from about 300 sccm to about 700 sccm, through an ALD valve having a pulse time of about 1 seconds or less. The process may further provide pulses of the nitrogen precursor gas (e.g., ammonia) may be provided from another gas source at a flow rate within a range from about 20 sccm and about 1,000 sccm, preferably, from about 100 sccm to about 300 sccm, through an ALD valve having a pulse time of about 1 second or less. An argon purge gas may have a flow rate within a range from about 1 slm to about 12 slm sccm, preferably, from about 2 slm to about 8 slm, and may be continuously provided from the gas source through the valves, as well as through other inlets on the processing chamber. The time between pulses of the tantalum precursor and the nitrogen precursor may be about 0.5 seconds or less.

In one embodiment, a tantalum nitride layer may be deposited to a sidewall of a via or a similar aperture with a thickness of about 50 Å or less, preferably, about 20 Å or less, and more preferably, about 10 Å or less. A tantalum nitride layer with a thickness of about 10 Å or less is believed to be a sufficient thickness in the application as a barrier layer to prevent copper diffusion. In other embodiments, the tantalum nitride layer may have a thickness greater than 50 Å. In one aspect, a thin barrier layer containing tantalum nitride deposited by the processes described herein may be used in filling submicron (e.g., less than 0.15 µm) and smaller features having high aspect ratios (e.g., greater than 5 to 1).

"Atomic layer deposition" (ALD), as used herein, refers to the sequential introduction of two or more reactive compounds to deposit a layer of material on a substrate surface. The two, three, or more reactive compounds may alternatively be introduced into a reaction zone or process region of a processing chamber. The reactive compounds may be in a state of gas, plasma, vapor, fluid or other state of matter useful for a vapor deposition process. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay a purge gas is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In an alternative embodiment, a first precursor containing compound A, a second precursor containing compound B and a third precursor containing compound C are each separately pulsed into the processing chamber. Alternatively, a pulse of a first precursor may overlap in time with a pulse of a second precursor while a pulse of a third precursor does not overlap in time with either pulse of the first and second precursors. "Process gas" as used herein refers to a single gas, multiple gases, a gas containing a plasma, combinations of gas(es) and/or plasma(s). A process gas may contain at least one reactive compound for a vapor deposition process. The reactive compounds may be in a state of gas, plasma, vapor, fluid, or other state of matter useful for a vapor deposition process. Also, a process gas may contain a purge gas or a carrier gas and not contain a reactive compound.

"Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten silicide nitride, tantalum, tantalum nitride, or tantalum silicide nitride. Substrates may have various dimensions, such as 200 mm or 300 mm diameter wafers, as well as, rectangular or square panes. Substrates include semiconductor substrates, display substrates (e.g., LCD), solar panel substrates, and other types of substrates. Unless otherwise noted, embodiments and examples described herein may be conducted on substrates with a 200 mm diameter or a 300 mm diameter. Substrates on which embodiments described herein may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a treatment process to polish, etch, reduce, oxidize, hydroxylate, anneal, and/or heat the substrate surface.

Although the inventions have been described in terms of specific embodiments, one skilled in the art will recognize that various changes to the reaction conditions, e.g., temperature, pressure, film thickness and the like can be substituted and are meant to be included herein and sequence of gases being deposited. For example, sequential deposition process may have different initial sequence. The initial sequence may include exposing the substrate to the nitrogen precursor gas before the tantalum precursor gas is introduced into the processing chamber. In addition, the tantalum nitride layer may be employed for other features of circuits in addition to functioning as a diffusion barrier for contacts. Therefore, the scope of the invention should not be based upon the foregoing description. Rather, the scope of the invention should be determined based upon the claims recited herein, including the full scope of equivalents thereof.

While the foregoing is directed to embodiments of the invention, other and further embodiments of the invention may be devised without departing from the basic scope thereof, and the scope thereof is determined by the claims that follow.

The invention claimed is:

1. A method for depositing a material on a substrate surface, comprising:
    exposing a substrate sequentially to an alkylamino metal precursor gas with an alkylamine ligand and a nitrogen precursor gas while depositing a first layer of a material comprising a metal nitride on the substrate within a processing chamber at a first deposition rate during a first atomic layer deposition process;
    subsequent to depositing the first layer, exposing the substrate sequentially to the alkylamino metal precursor as and the nitrogen precursor gas while depositing a second layer of the material comprising the metal nitride on the substrate within the processing chamber at a second deposition rate during a second atomic layer deposition process; and
    exposing the substrate to a treatment gas comprising an alkylamine compound prior to or during the second atomic layer deposition process in an amount necessary to reduce the second deposition rate to about 95% or less of the first deposition rate, wherein the alkylamine compound flows into the processing chamber and forms a coating of the alkylamine compound on the substrate and wherein the alkylamine compound has the same chemical structure as the alkylamine ligand.

2. The method of claim 1, wherein the substrate is continuously exposed to the treatment gas during the second atomic layer deposition process.

3. The method of claim 1, wherein the substrate is periodically exposed to the treatment gas during the second atomic layer deposition process.

4. The method of claim 1, wherein the substrate is exposed to the treatment gas prior to the second atomic layer deposition process.

5. The method of claim 1, wherein the second deposition rate is about 90% or less of the first deposition rate.

6. The method of claim 1, wherein the second deposition rate is within a range from about 0.05 Å/cycle to about 1.0 Å/cycle.

7. The method of claim 6, wherein the second deposition rate is about 0.5 Å/cycle.

8. The method of claim 1, wherein the alkylamine compound has the chemical formula of $H_2NR$ or $HNR'R''$, where each R, R', and R'' is independently selected from the group consisting of methyl, ethyl, propyl, butyl, amyl, phenyl, aryl, isomers thereof, derivatives thereof, and combinations thereof.

9. The method of claim 8, wherein the alkylamine compound is selected from the group consisting of methylamine, dimethylamine, ethylamine, diethylamine, methylethylamine, propylamine, dipropylamine, butylamine, dibutylamine, isomers thereof, derivatives thereof, and combinations thereof.

10. The method of claim 1, wherein the alkylamino metal precursor gas comprises a tantalum precursor selected from the group consisting of pentakis(dimethylamino) tantalum, pentakis(diethylamino) tantalum, pentakis(ethylmethylamino) tantalum, tert-butylimino tris(dimethylamino) tantalum, tert-butylimino tris(diethylamino) tantalum, tert-butylimino tris(ethylmethylamino) tantalum, tert-amylimino-tris(dimethylamino) tantalum, tert-amylimino-tris(diethylamino) tantalum, tert-amylimino-tris(ethylmethylamino) tantalum, and derivatives thereof.

11. The method of claim 10, wherein the tantalum precursor is pentakis(dimethylamino) tantalum and the alkylamine compound comprises methylamine or dimethylamine.

12. The method of claim 10, wherein the material deposited comprises tantalum nitride.

13. The method of claim 12, wherein the nitrogen precursor gas comprises ammonia.

14. The method of claim 1, wherein the treatment gas further comprises at least one carrier gas selected from the group consisting of ammonia, hydrogen, nitrogen, argon, helium, and combinations thereof.

15. The method of claim 14, wherein the treatment gas comprises dimethylamine, ammonia, and argon.

16. A method for depositing a material on a substrate surface, comprising:
    exposing a substrate sequentially to an alkylamino metal precursor gas with an alkylamine ligand and a chemical precursor gas while depositing a first layer of a material on the substrate at a first deposition rate during a first atomic layer deposition process within a processing chamber;
    subsequent to depositing the first layer, depositing a second layer of the material on the substrate at a second deposition rate during a second atomic layer deposition process; and
    exposing the substrate to a treatment gas comprising an alkylamine compound prior to or during the second atomic layer deposition process in an amount necessary to reduce the second deposition rate to a rate less than the first deposition rate, wherein the alkylamine compound has the same chemical structure as the alkylamine ligand and wherein the substrate contains the first layer of the material and the alkylamine compound during the second atomic layer deposition process.

17. The method of claim 16, wherein the second deposition rate is about 95% or less of the first deposition rate.

18. The method of claim 16, wherein the second deposition rate is within a range from about 0.05 Å/cycle to about 1.0 Å/cycle.

19. The method of claim 18, wherein the second deposition rate is about 0.5 Å/cycle.

20. The method of claim 16, wherein the alkylamino metal precursor gas comprises a tantalum precursor selected from the group consisting of pentakis(dimethylamino) tantalum, pentakis(diethylamino) tantalum, pentakis(ethylmethylamino) tantalum, tert-butylimino tris(dimethylamino) tantalum, tert-butylimino tris(diethylamino) tantalum, tert-butylimino tris(ethylmethylamino) tantalum, tert-amylimino-tris(dimethylamino) tantalum, tert-amylimino-tris(diethylamino) tantalum, tert-amylimino-tris(ethylmethylamino) tantalum, and derivatives thereof.

21. The method of claim 20, wherein the tantalum precursor is pentakis(dimethylamino) tantalum and the alkylamine compound comprises methylamine or dimethylamine.

22. The method of claim 20, wherein the chemical precursor gas comprises ammonia and the material deposited comprises tantalum nitride.

23. The method of claim 16, wherein the treatment gas comprises dimethylamine, ammonia, and argon.

24. A method for depositing a material on a substrate surface, comprising:
    exposing a substrate disposed within the processing chamber to a carrier gas having a continuous flow;
    exposing the substrate sequentially to a tantalum precursor gas having a dimethylamine ligand and a nitrogen precursor gas while depositing a first layer of a tantalum nitride material on the substrate at a first deposition rate during a first atomic layer deposition process, wherein the tantalum precursor gas comprises pentakis(dimethylamino) tantalum, and the first atomic layer deposition process comprises sequentially pulsing the tantalum precursor gas and the nitrogen precursor gas into the carrier gas with the continuous flow to deposit the tantalum nitride material; and subsequently introducing a treatment gas comprising dimethylamine to the carrier gas having the continuous flow and exposing the substrate to the treatment gas while exposing the substrate sequentially to the tantalum precursor gas and the nitrogen precursor gas to deposit a second layer of the tantalum nitride material at a second deposition rate during a second atomic layer deposition process, wherein the treatment gas is introduced to the carrier gas in an amount necessary to reduce the second deposition rate to rate less than the first deposition rate.

25. The method of claim 24, wherein the second deposition rate is about 95% or less of the first deposition rate.

* * * * *